United States Patent
Akasaki et al.

(10) Patent No.: US 7,183,578 B2
(45) Date of Patent: Feb. 27, 2007

(54) SEMICONDUCTOR APPARATUS, METHOD FOR GROWING NITRIDE SEMICONDUCTOR AND METHOD FOR PRODUCING SEMICONDUCTOR APPARATUS

(75) Inventors: Isamu Akasaki, Nagoya (JP); Hiroshi Amano, Nagoya (JP); Satoshi Kamiyama, Nagoya (JP); Takanori Yasuda, Kyoto (JP); Toshiya Matsuda, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 11/365,459

(22) Filed: Feb. 28, 2006

(65) Prior Publication Data

US 2006/0145166 A1 Jul. 6, 2006

Related U.S. Application Data

(62) Division of application No. 10/810,309, filed on Mar. 26, 2004.

(30) Foreign Application Priority Data

| Mar. 26, 2003 | (JP) | P2003-085941 |
| Mar. 26, 2003 | (JP) | P2003-085942 |
| Mar. 26, 2003 | (JP) | P2003-085955 |
| May 23, 2003 | (JP) | P2003-146965 |
| May 28, 2003 | (JP) | P2003-151697 |

(51) Int. Cl.
*H01L 27/15* (2006.01)

(52) U.S. Cl. ............. 257/79; 257/94; 257/99; 257/103

(58) Field of Classification Search ............. None
See application file for complete search history.

(56) References Cited

U.S. PATENT DOCUMENTS

| 4,855,249 A | 8/1989 | Akasaki et al. |
| 5,122,845 A | 6/1992 | Manabe et al. |
| 6,566,218 B2 | 5/2003 | Otani et al. |
| 6,583,468 B2 | 6/2003 | Hori et al. |

(Continued)

FOREIGN PATENT DOCUMENTS

EP  1 176 231  1/2002

(Continued)

OTHER PUBLICATIONS

Suda, et al., Heteroepitaxial Growth of Group-III Nitrides on Lattice-Matched Metal Boride $ZrB_2$ (0001) by Molecular Beam Epitaxy—Department of Electronic Science and Engineering, Kyoto University—13th International Conference Crystal Growth, Aug. 2001, 02a-SB2-20.

(Continued)

*Primary Examiner*—Wai-Sing Louie
(74) *Attorney, Agent, or Firm*—Hogan & Hartson LLP

(57) ABSTRACT

A semiconductor apparatus includes a substrate made of a diboride single crystal expressed by a chemical formula $XB_2$, in which X includes at least one of Ti, Zr, Nb and Hf, a semiconductor buffer layer formed on a principal surface of the substrate and made of $Al_yGa_{1-y}N$ ($0<y\leq1$), and a nitride semiconductor layer which is formed on the semiconductor buffer layer and which includes at least one kind or plural kinds selected from among 13 group elements and As.

9 Claims, 13 Drawing Sheets

U.S. PATENT DOCUMENTS

| | | | |
|---|---|---|---|
| 6,597,023 | B2 | 7/2003 | Shibata et al. |
| 6,707,076 | B2 | 3/2004 | Hori et al. |
| 6,765,244 | B2 | 7/2004 | Shibata et al. |
| 6,829,273 | B2 * | 12/2004 | Amano et al. ............ 372/45.01 |
| 6,830,948 | B2 | 12/2004 | Koike et al. |
| 6,835,965 | B2 | 12/2004 | Tanaka et al. |
| 6,841,800 | B2 * | 1/2005 | Oku et al. .................... 257/94 |
| 2004/0058465 | A1 | 3/2004 | Taki |

FOREIGN PATENT DOCUMENTS

| | | |
|---|---|---|
| EP | 1 213 767 | 6/2002 |
| EP | 1 263 031 | 12/2002 |
| EP | 1 276 140 | 1/2003 |
| JP | 62-119196 | 5/1987 |
| JP | 2-229476 | 9/1990 |
| JP | 4-321280 | 11/1992 |
| JP | 2002-043223 | 2/2002 |

OTHER PUBLICATIONS

Yukawa, et al.—62nd Autumn Meeting, 2001; Japan Society of Applied Physics, 12-R-14.

Yohei Yukawa, "Study on the crystal growth and properties of group-III nitride semiconductors on $ZrB_2$ substrates by metalorganic vapor phase epitaxy" Department of Electronic Science and Engineering Graduate School of Meijo University.

* cited by examiner

SURFACE STATE B (250 μm × 190 μm)

SURFACE STATE A (250 μm × 190 μm)

FIG. 9
(5)
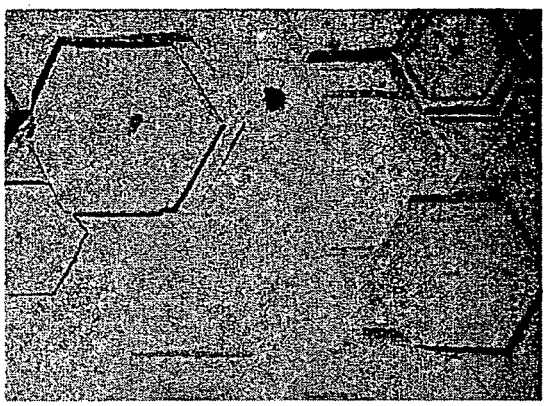
100°C OR MORE  0.25  873 SECONDS
(1)
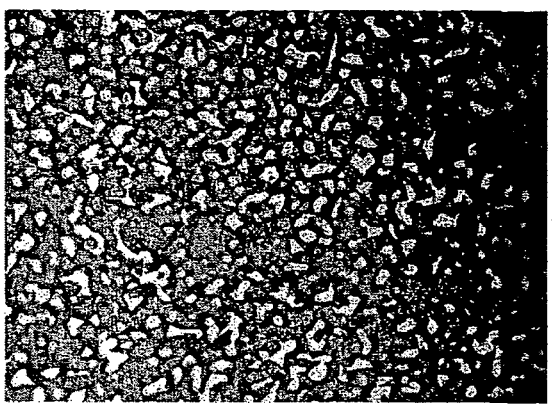
400°C  0.8  —
(2)
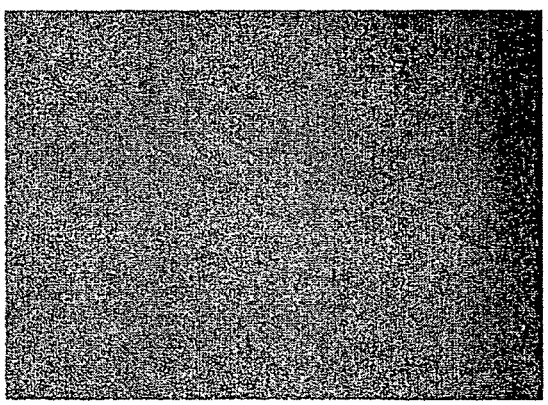
725°C  0.6  760 SECONDS
(3)
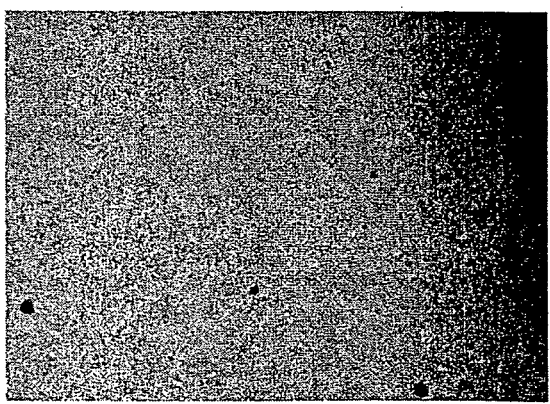
850°C  0.5  596 SECONDS
(4)
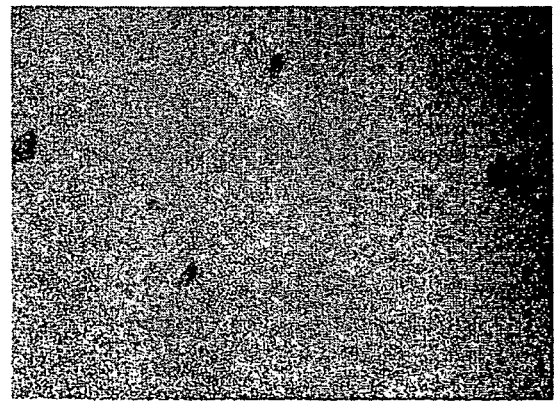
925°C  0.4  —

RELATION BETWEEN FILM THICKNESS OF $(AlN)_x(GaN)_{1-x}$ AND X-RAY HALF VALUE WIDTH

SURFACE STATE B (250 μm × 190 μm)

SURFACE STATE A (250 μm × 190 μm)

SEMICONDUCTOR APPARATUS, METHOD FOR GROWING NITRIDE SEMICONDUCTOR AND METHOD FOR PRODUCING SEMICONDUCTOR APPARATUS

This is a divisional of application Ser. No. 10/810,309 filed Mar. 26, 2004, which application is hereby incorporated by reference in its entirety.

BACKGROUND OF THE INVENTION

1. Field of the Invention

The invention relates to a semiconductor apparatus and specifically relates to a semiconductor apparatus, a method for growing a nitride semiconductor and a method for producing a semiconductor apparatus which are suitable for a light emitting device and a light receiving device such as a light emitting diode (LED), a laser diode (LD), a solar cell and a photosensor, and an electronic device such as a transistor and a power device.

2. Description of the Related Art

A nitride semiconductor containing Ga as a main constituent (a GaN semiconductor) is utilized as a material for an optical device such as a light emitting diode of blue light or violet light, a laser diode and a photodetector. Moreover, attention is given to the GaN semiconductor as a high-performance material for an electronic device as well, because the GaN semiconductor is capable of satisfying high frequency and high electric power, and is highly reliable.

Further, a light emitting diode using the GaN semiconductor is known (refer to Japanese Unexamined Patent Publication JP-A 4-321280 (1992), for example). An example of a structure of such a light emitting diode is shown in FIG. 17. A GaN buffer layer 21 is formed on a sapphire ($Al_2O_3$) substrate 20, and on the GaN buffer layer 21 is formed a growth layer made of a GaN semiconductor layer having a multilayer structure made by sequentially laminating an n-GaN layer 22 of the n-type semiconductor layer, an n-AlGaN cladding layer 23 of the n-type semiconductor layer, an InGaN light emitting layer 24, a p-AlGaN cladding layer 25 of the p-type semiconductor layer and a p-GaN layer 26 of the p-type semiconductor layer. In part of the growth layer, a region from the p-GaN layer 26 to (an upper portion of the n-GaN layer 22) is etched and removed, and thus part of the n-GaN layer 22 is exposed. The n-type electrode 28 is formed on an upper surface of the exposed region, and the p-type electrode 27 is formed on an upper surface of the p-GaN layer 26 of an uppermost layer.

Since production of a single crystal substrate of the GaN semiconductor is difficult, there is a need to form a semiconductor apparatus using the GaN semiconductor on a substrate made of a different material. Although sapphire is generally used as the substrate 20, a Si substrate, a ZnO substrate, an $MgO \cdot Al_2O_3$ (spinel) substrate, a SiC substrate, a GaAs substrate and the like are tested other than the sapphire substrate.

In the case of growing the GaN semiconductor layers on the sapphire substrate 20, a problem is a lattice mismatch between them. A relation of lattice constants thereof is as shown below. GaN grows in a direction rotated through 30° from an a axis on a c plane of the sapphire substrate.

Regarding sapphire, a lattice constant a (which is described as $a_1$ in Table 1 described later) is 4.7580 Å. An interval value (which is described as $a_2$ in Table 1 described later when a lattice rotates through 30° is 2.747 obtained by 4.758×1/1.732 (a numerical value obtained by multiplying a length of the a axis in a unit lattice of sapphire by 1/1.732 becomes a reference). On the other hand, regarding GaN, a lattice constant a is 3.1860 Å.

A ratio of the lattice mismatch of GaN with reference to sapphire becomes +15.98% (=100×(3.1860−2.747)/2.747). Thus, the lattice constant of sapphire is significantly different from the lattice constant of GaN. Consequently, a good quality crystal cannot be obtained when GaN is directly grown on sapphire. Besides, it is possible to consider a substrate made of a material of another kind in the same manner.

In a prior art, in order to increase crystalline quality of the growth layer, a buffer layer made of an AlN or GaN material which is amorphous or polycrystalline is formed on the (0001) plane of the sapphire substrate 20 in advance, and the GaN growth layer is formed on the buffer layer. The buffer layer has a function of reducing the lattice mismatch between the GaN growth layer and the sapphire substrate and increasing crystalline quality.

Further, in the case of a semiconductor apparatus such as a laser diode or a transistor which requires a better quality crystal, after the GaN semiconductor layer is once grown on the single crystal substrate 20, the single crystal substrate 20 is eliminated, and then the semiconductor apparatus is formed. This is because when the semiconductor apparatus is formed on a substrate 20 made of a different material from the semiconductor apparatus, a crystal defect which results from a difference in coefficient of thermal expansion occurs in a cooling process after crystal growth at high temperatures of 1000° C. or more.

Furthermore, in another prior art, there is also a method for growing the GaN semiconductor layer 22 in which a mask made by patterning a $SiO_2$ thin film is formed and the GaN semiconductor is grown on the mask in a lateral direction, in order to avoid an influence by the lattice mismatch with the substrate 20.

However, since the ratio of the lattice mismatches between the sapphire substrate 20 and the GaN layer 22 is as large as 15.98%, the GaN growth layer 22 contains dislocations whose density is $10^8$ to $10^{11}$ cm$^{-2}$ even when formed via the buffer layer 21 made of an AlN or GaN material. Moreover, even a layer of a GaN crystal laterally grown after elimination of the sapphire substrate 20 contains dislocations whose density is $10^4$ to $10^7$ cm$^{-2}$. They contain extremely large dislocations as compared with GaAs grown on a GaAs substrate containing dislocations whose density is $10^2$ cm$^{-2}$ to $10^7$ cm$^{-2}$.

The dislocation density of the GaN growth layer significantly restricts performance of a semiconductor apparatus to be produced from this, and moreover, there is a need to increase the amount of additive elements in the semiconductor layer for generation of sufficient carrier. This has a problem of deteriorating a characteristic of a semiconductor apparatus, such as a life, a withstand voltage, a driving voltage, consumed electric power (operation efficiency), an operation speed or a leak current.

Then, in a proposed art, growth of a nitride semiconductor on a diboride single crystal substrate expressed by a chemi cal formula $XB_2$, in which X contains at least one of Ti and Zr, is proposed.

TABLE 1

|  | Lattice constant [Å] | Coefficient of thermal expansion [×10⁻⁶/K] |
| --- | --- | --- |
| $ZrB_2$ | 3.1696 | 5.9 |
| $TiB_2$ | 3.0303 | |
| Sapphire($Al_2O_3$) | $a_1 = 4.7580$, $a_2 = 2.747$ | 7.5 |
| GaN | 3.1860 | 5.6 |
| AlN | 3.1114 | 4.2 |
| BN | 2.5502 | |
| InN | 3.54 | 5.7 |
| SiC | 3.08 | 4.3 |
| GaAs | 4.00 | 8.7 |
| Si | 3.84 | 2.6 |

Since the nitride semiconductor is formed with a good lattice match relation with the diboride single crystal substrate in this manner, a lattice defect in the growth layer is small, and crystalline quality of the nitride film is extremely good.

However, in the aforementioned prior art, for example, when GaN is crystal-grown as the nitride semiconductor on the diboride single crystal substrate, because of a change of a growth temperature in a growth process, B in the substrate diffuses into the crystal-grown GaN crystal, and a nitride semiconductor GaBN which contains a ternary 13 group (a former IIIB group element) is generated on an interface between the GaN and the substrate. In the case of BN, as shown in Table 1, a mismatch of lattice constants becomes as large as approximately 20%, as compared with GaN (for example, $(2.5502-3.1696)/3.1696=19.5\%$). Therefore, in the case of GaBN, which is a ternary nitride semiconductor, a difference of lattice constants becomes significantly large as a mixed crystal ratio of B becomes large, unlike AlGaN, which is a ternary nitride semiconductor which the mismatch ratio of lattice constants is 2% or less. Consequently, a lattice defect occurs on the interface even when GaN is grown on the diboride single crystal substrate as described above, and a good quality crystal cannot be obtained.

In recent years, research and development of a nitride semiconductor which contains at least one selected from among B, Al, Ga, In and Ti have become active, and applied technique has rapidly developed. Then, at present, a light emitting diode of green, blue and ultraviolet, a laser diode of blue and violet, and the like using the nitride semiconductor is put to practical use.

In specific, $(InN)_x(GaN)_{1-x}$ whose band gap covers from red to violet and $(AlN)_x(GaN)_{1-x}N$ whose band gap covers from violet to ultraviolet are positioned as main materials among III group nitride semiconductors, because the former makes it possible to realize a device emitting light of blue green, blue, violet or the like which was not realized before, and the latter makes it possible to expect application as a light source for measurement, sterilization or excitation.

The III group nitride semiconductor is grown from vapor phase on a single crystal substrate made of sapphire, SiC, GaAs, Si or the like by a MOVPE (Metalorganic Vapor Phase Epitaxy) method.

The III group nitride semiconductor is a hexagonal symmetry, and a-axis lattice constants of InN, GaN and AlN are 0.311 nm, 0.319 nm and 0.354 nm, respectively. Moreover, respective lattice constants of $(InN)_x(GaN)_{1-x}$ and $(AlN)_x(GaN)_{1-x}$ are values in a middle range of the respective aforementioned lattice constants of InN, GaN and AlN depending on x.

However, since intervals between atoms that sapphire, SiC, GaAs and Si should achieve lattice matches with the III group nitride semiconductor are 0.275 nm, 0.308 nm, 0.400 nm and 0.384 nm, respectively (refer to Table 1), and substrates which completely achieve lattice matches are not obtained.

In the meantime, in another prior art a technique on a low-temperature buffer layer is proposed (refer to Japanese Examined Patent Publication JP-B2 4-15200 (1992) and Japanese Patent 3026087, for example).

It is possible to grow a good quality crystal on the lattice mismatching substrates described above by using these technique, however, penetration dislocations of approximately $10^8$ cm⁻² to $10^{11}$ cm⁻² still exitss. Moreover, differences in the coefficient of thermal expansion between the above single crystal substrates and the nitride semiconductor are large, and a difference in contraction amounts after crystal growth at a high temperature of approximately 1000° C. causes cracks.

As a method for solving these problems, in another prior art a technique of growing a nitride semiconductor on the (0001) plane of a $ZrB_2$ single crystal substrate is proposed (refer to Japanese Unexamined Patent Publication JP-A 2002-43223).

The $ZrB_2$ single crystal substrate is a hexagonal symmetry, and a lattice constant of an a axis is 0.317 nm (refer to table 1), which completely achieves a lattice match with 0.26 of x of $(AlN)_x(GaN)_{1-x}$. Moreover, the coefficient of thermal expansion is $5.9 \times 10^{-6}$ K⁻¹, which is a close value to $5.6 \times 10^{-6}$ K⁻¹ of that of GaN.

Further, the $ZrB_2$ single crystal substrate, whose resistivity is as small as 4.6 μΩ·cm, is electrically conductive. On the other hand, a sapphire substrate 110 generally used as a substrate up to now is insulative, and therefore, a light emitting diode formed on the sapphire substrate has a structure such that two electrodes 101 and 109 are disposed on the same plane side (the upper side of the substrate 110 in FIG. 18) as shown in FIG. 18.

The structure shown in FIG. 18 is a structure in which a low-temperature buffer layer 107, the n-type contact layer 106, the n-type cladding layer 105, a light emitting layer 104, the p-type cladding layer 103 and the p-type contact layer 102 are sequentially laminated on a sapphire substrate 110, and furthermore, a p electrode 101 is formed thereon. Moreover, an n electrode 109 is formed on an exposed surface of the n-type contact layer 106.

As described above, in the last one or two years, research and development of the technique of growing the nitride semiconductor on the $ZrB_2$ single crystal substrate have progressed.

According to "Abstr. 13th Int. Conf. Crystal Growth, August 2001, 02a-SB2-20", a technique of enabling growth of GaN on the (0001) plane of the $ZrB_2$ single crystal substrate by an MBE method is proposed.

However, this technique has a problem that it is inferior in mass production because it uses the MBE method.

Further, a technique of growing GaN on the (0001) plane of the $ZrB_2$ single crystal substrate by using an AlN buffer layer by the MOVPE method is also proposed (refer to Ext. Abstr. (62nd Autumn Meet. 2001); Japan Society of Applied Physics, 12p-R-14).

Further, in the prior art, a GaN film grown on the (0001) plane of a $ZrB_2$ single crystal substrate by an MOVPE method has a problem that a surface shape thereof tends to become uneven as shown in FIG. 13.

As described above, in the case of growing a nitride semiconductor on the (0001) plane of the $ZrB_2$ single crystal substrate by using an AlN buffer layer, it is desired to reduce unevenness appearing on a surface shape thereof.

However, according to both the techniques, in the GaN film grown on the (0001) plane of the $ZrB_2$ single crystal substrate, a rocking curve FWHM (TILT) of (0002) plane omega scan by an X-ray diffraction method, which becomes an indicator of evaluation of quality, is approximately 1000 arcseconds, which is not sufficiently good (refer to "Study on the crystal growth and properties of group-III nitride semiconductors on $ZrB_2$ substrate by metalorganic vapor phase epitaxy" master's thesis written by Yohei Yukawa, graduate school of Meijo University, 2001).

Furthermore, since AlN is insulative, when the light emitting diode or the like with the structure as shown in FIG. 8 as described later is produced, resistance from the nitride semiconductor layer to the substrate becomes high, and an operation voltage becomes high.

Still further, a band gap of AlN is as large as 6.2 eV, and therefore, it is difficult to decrease resistance by doping.

In the aforementioned prior art, when the nitride semiconductor is grown on the (0001) plane of the $ZrB_2$ single crystal substrate, resistance from the nitride semiconductor layer to the substrate becomes high, and the operation voltage becomes high.

In recent years, a nitride semiconductor such as gallium nitride (GaN), indium nitride (InN) or aluminum nitride (AlN) is used as a material for an optical device such as a light emitting diode of blue light or violet light, a laser diode or a photodetector, because the nitride semiconductor is a compound semiconductor of direct transition type, and has a wide band gap.

Further, since the nitride semiconductor is capable of satisfying high frequency or high electric power, and is highly reliable, the nitride semiconductor is noted as a high-performance material for an electronic device.

Up to now, there is no substrate that achieves a lattice match with the nitride semiconductor. In a conventional art, the nitride semiconductor is grown by the use of a substrate made of a material, such as a sapphire substrate different kind from nitride semiconductor.

However, for example, regarding the sapphire substrate and GaN, a ratio of lattice mismatch is 13.8% and a difference in the coefficient of thermal expansion is $3.2 \times 10^{-6}$/K, and there is a problem resulting from the mismatch such that dislocations of $10^8$ to $10^{10}$ $cm^{-2}$ arises in the GaN film because of a crystal defect caused on an interface between the sapphire substrate and the GaN film.

Further, because of the defect and thermal distortion, the GaN film is warped, and crystalline quality is significantly deteriorated.

Furthermore, considering production of a device such as a laser diode, the nitride semiconductor is formed on a substrate made of a material of different kind from the nitride semiconductor such as GaN and the like, and therefore, there arises such a problem that, in the case of forming a reflection surface of a laser resonator, cleaved planes of the substrate made of a material and the nitride semiconductor are different, and that formation by cleavage is difficult. Accordingly, a good quality nitride semiconductor substrate has been expected.

However, regarding the nitride semiconductor such as GaN, a melting point is high and a dissociation pressure of nitride is high at the melting point, and therefore, production of a bulk single crystal is difficult. Consequently, as described before, for example, by growing a thick film of GaN on the sapphire substrate and then separating the sapphire substrate, which is made of a material of different kind from GaN, and the GaN thick film, the nitride semiconductor apparatus is produced.

However, in the step of separating the substrate and the nitride semiconductor in the aforementioned production method, a method of abrading the substrate arises a problem that stress from the nitride semiconductor thick film becomes large as the substrate becomes thin, and that the stress acts on the substrate, thereby worsening a warp thereof and causing cracks.

In the meantime, as prior art another separation method, there is, for example, a method of separating by locally irradiating the interface between the sapphire substrate and the GaN thick film with a laser light beam and subliming the interface (a laser lift off method).

However, according to this method, only a small part of the interface is separated because an area irradiated is small, and stress concentrates on a small attaching part, with the result that cracks are caused. Moreover, since the area irradiated is small, a time period for treatment is long.

By the way, as a method for reducing dislocations caused in the nitride semiconductor thick film, an ELO growth (Epitaxial Lateral Overgrowth) method is proposed.

The conventional ELO growth method is exemplified in FIG. 19.

After an AlN buffer layer 321 is grown on a sapphire substrate 320 as shown in FIG. 19A, a first GaN layer 322 is grown as shown in FIG. 19B.

After that, a $SiO_2$ film 325 is formed on the first GaN layer 322 as shown in FIG. 19C, and a slit line of $SiO_2$ is formed in the [11-20] direction in mask treatment as shown in FIG. 19D.

Then, a arcsecond GaN layer 323 is grown again as shown in FIG. 19E.

Finally, the sapphire substrate 320 is separated as shown in FIG. 19F. The arcsecond GaN layer 323 grows from a slit window, and completely fills in the $SiO_2$ line to become a flat film, because a speed of a longitudinal growth in the [1-100] direction is faster than a speed of growth in the [0001] direction. Although dislocation curves in a longitudinal direction in accordance with the longitudinal growth, and penetration dislocations on the $SiO_2$ line can be reduced, the penetration dislocations concentrate on a part of the $SiO_2$ slit window. Therefore, in order to produce a device by selecting a region with small penetration dislocation, it is only necessary to carry out mask treatment on the $SiO_2$ line.

However, since $SiO_2$ is filled in, it is difficult to carry out mask treatment on $SiO_2$. Moreover, since curved dislocations concentrate on a central portion on the $SiO_2$ line, there arises a problem of inclination of crystal orientation in a horizontal direction of the substrate, for example. Furthermore, since crystal growth is carried out while $SiO_2$ is contained, diffusion of Si and oxygen atoms occurs. In addition, the ELO growth method needs a complicated production process, and therefore, brings about cost increase.

As described above, according to the conventional production methods, when the substrate made of a material of different kind from nitride semiconductor and the nitride semiconductor thick film are separated, stress resulting from differences in lattice constants and the coefficient of thermal expansion causes a warp and cracks on the produced nitride semiconductor apparatus. Moreover, the production process is complicated in the ELO growth that reduces dislocations, and it is difficult to keep away from a portion on the which penetration dislocation density concentrates, and to carry out the mask treatment on contained $SiO_2$. Furthermore, there arises a problem of inclination of crystal orientation in a horizontal direction of the substrate because of curved dislocation, for example.

SUMMARY OF THE INVENTION

Accordingly, the present invention was made in consideration of the aforementioned problems, and an object thereof is to provide excellent semiconductor apparatus and production methods with a small lattice defect by which a good characteristic can be expected.

Another object of the invention is to provide a semiconductor apparatus and production methods which, for example, at a time of growing the nitride semiconductor on the (0001) plane of a $ZrB_2$ single crystal substrate, makes electric resistance from the nitride semiconductor to the substrate to be small and increases crystalline quality of the nitride semiconductor grown.

Still another object of the invention is to provide a semiconductor apparatus and production methods to reduce unevenness appearing on surface shape thereof in the case of growing a nitride semiconductor on the (0001) plane of the diboride single crystal substrate by using an AlN buffer layer, it is desired to reduce unevenness appearing on a surface shape thereof.

Still another object of the invention thereof is to, in a nitride semiconductor apparatus, avoid a warp and cracks of the apparatus and decrease dislocation density, and to provide a nitride semiconductor apparatus and production methods which are uniform.

The invention provides a semiconductor apparatus comprising:

a substrate made of a diboride single crystal expressed by a chemical formula $XB_2$, in which X includes at least one of Ti, Zr, Nb and Hf;

a semiconductor buffer layer formed on a principal surface of the substrate and made of $Al_yGa_{1-y}N$ ($0<y\leq 1$); and a nitride semiconductor layer formed on the semiconductor buffer layer, including at least one kind or plural kinds selected from among 13 group elements and As.

Further, the invention provides a semiconductor apparatus comprising:

a substrate made of a diboride single crystal expressed by a chemical formula $XB_2$, in which X includes at least one of Ti, Zr, Nb and Hf;

a semiconductor buffer layer formed on a principal surface of the substrate and made of $(AlN)_x(GaN)_{1-x}$ ($0<x\leq 1$); and a nitride semiconductor layer formed on the semiconductor buffer layer, including at least one kind or plural kinds selected from among 13 group elements and As.

$0.1\leq x\leq 1.0$ is preferable.

Consequently, diffusion of B, which is a main element contained in a diboride single crystal substrate, and formation of a nitride semiconductor containing B on an interface between the substrate and a nitride semiconductor are avoided, and it is possible to obtain a nitride semiconductor with a small crystal defect, which is good quality and excellent.

In the invention, the substrate is of $ZrB_2$ or $TiB_2$.

In the invention, the substrate is a solid solution containing one or a plurality of impurity elements of 5 atom % or less, the one or a plurality of impurity elements being selected from a group consisting of Ti, Cr, Hf, V, Ta and Nb when the substrate is of $ZrB_2$, or selected from a group consisting of Zr, Cr, Hf, V, Ta and Nb when the substrate is of $TiB_2$.

In the invention, the thickness of the semiconductor buffer layer made of $(AlN)_x(GaN)_{1-x}$ is within a range of 10 to 100 nm.

In the invention, x of the semiconductor buffer layer made of $(AlN)_x(GaN)_{1-x}$ is $0.1\leq x\leq 1$.

In the invention, x of the semiconductor buffer layer made of $(AlN)_x(GaN)_{1-x}$ is $0.4\leq x\leq 0.6$.

In the invention, an angle $\theta 1$ formed by a normal line of the principal surface of the substrate and a normal line of the (0001) plane of the substrate is $0°\leq \theta 1\leq 5°$.

Further, the invention provides a method for growing a nitride semiconductor, comprising:

on a substrate of a diboride single crystal expressed by a chemical formula $XB_2$, in which X includes at least one of Ti, Zr, Nb and Hf, growing $Al_yGa_{1-y}N$ layer ($0<y\leq 1$) from vapor phase, and subsequently, growing a nitride semiconductor layer including at least one kind selected from among 13 group elements and As from vapor phase.

Further, the invention provides a method for growing a nitride semiconductor, comprising:

on a substrate of a diboride single crystal expressed by a chemical formula $XB_2$, in which X includes at least one of Ti, Zr, Nb and Hf, growing an $(AlN)_x(GaN)_{1-x}$ layer ($0<x\leq 1$) from vapor phase within a temperature range of more than 400° C. and less than 1100° C. by an MOVPE method, and subsequently, growing a nitride semiconductor layer including at least one kind selected from among 13 group elements and As from vapor phase.

In the invention, the thickness of the $(AlN)_x(GaN)_{1-x}$ layer is within a range of 10 to 100 nm.

According to the invention, as in the aforementioned structure, as a result of growing an $(AlN)_x(GaN)_{1-x}$ layer ($0<x\leq 1$) from vapor phase on the diboride single crystal substrate by an MOVPE method, and preferably, defining the thickness of this layer within a range of 10 nm to 100 nm, resistivity of $(AlN)_x(GaN)_{1-x}$ becomes lower than that of AlN, with the result that resistance from the nitride semiconductor to the substrate is decreased, and quality is increased because an a-axis lattice constant of $(AlN)_x(GaN)_{1-x}$ is closer to an a-axis lattice constant of the (0001) plane of the $ZrB_2$ single crystal than AlN. $0.1\leq x\leq 1.0$ is preferable. When x is less than 0.1, an $(AlN)_x(GaN)_{1-x}$ layer formed on the substrate made of $XB_2$ becomes to be exfoliated easily.

Further, it is possible to decrease resistance of $(AlN)_x(GaN)_{1-x}$ by doping, with the result that it is possible to reduce resistance from the nitride semiconductor to the substrate.

As described above, according to the invention, in the case of growing a nitride semiconductor layer which contains at least one selected from among B, Al, Ga, In and Ti on the (0001) plane of the diboride single crystal substrate expressed by a chemical formula $XB_2$, in which X contains at least one of Ti, Zr, Nb and Hf, by the MOVPE method, by growing the $(AlN)_x(GaN)_{1-x}$ layer ($0<x\leq 1$) between the diboride single crystal substrate and the nitride semiconductor layer at 400° C. to 1100° C., and preferably, growing to film thickness of 10 nm to 100 nm, crystalline quality of the nitride semiconductor is increased as apparent from that a rocking curve FWHM (TILT) of (0002) plane omega scan by an X-ray diffraction method is a value smaller than 1000 arcseconds. Therefore, according to the invention, a characteristic and the yield of a device such as a light emitting diode produced on the $ZrB_2$ single crystal substrate are increased.

Further, according to the invention, serial resistance is decreased because resistivity of $(AlN)_x(GaN)_{1-x}$ is lower than that of AlN. Furthermore, it is possible to decrease resistance of $(AlN)_x(GaN)_{1-x}$ by doping, so that it is possible to reduce resistance from the nitride semiconductor to the substrate. Consequently, it is possible to decrease a driving voltage of a light emitting diode of type shown in FIG. 3, which makes it possible to obtain a large number from one wafer.

In the invention, the semiconductor buffer layer is AlN.

In the invention, the thickness of the semiconductor buffer layer made of AlN is 10 to 250 nm.

In the invention, an angle θ1 formed by a normal line of the principal surface of the substrate and a normal line of the (0001) plane of the substrate is $0° \leq θ1 \leq 0.55°$.

Further, the invention provides a method for growing a nitride semiconductor, comprising:

on the (0001) plane of a substrate of a diboride single crystal expressed by a chemical formula $XB_2$, in which X includes at least one of Ti, Zr, Nb and Hf, growing an AlN layer from vapor phase so that a deviation angle of a normal line of a surface of the substrate from a direction of the [0001] becomes 0.55 degrees or less, and subsequently, growing a nitride semiconductor layer including at least one kind selected from among 13 group elements and As from vapor phase.

In the invention, the thickness of the AlN layer is within a range of 10 to 250 nm.

As described above, according to the invention, in the case of growing the nitride semiconductor layer containing at least one selected from among B, Al, Ga, In and Ti on the (0001) plane of the diboride single crystal substrate expressed by the chemical formula $XB_2$, in which X contains at least one of Ti, Zr, Nb and Hf, by the MOVPE method, by using a method of growing an AlN layer of 10 nm to 100 nm on the (0001) plane of the diboride single crystal substrate at 800° C. or less and thereafter growing the nitride semiconductor layer containing at least one selected from among B, Al, Ga, In and Ti, wherein a substrate in which a deviation angle of a normal line on a surface of the diboride single crystal substrate from a [0001] direction of diboride crystal is 0.55° degrees or less is used, it is possible to grow a nitride semiconductor layer which has a smooth surface.

As mentioned above, in a constitution that the buffer layer is made of AlN, the deviation angle θ1 is selected less than 0.55°. Thereby, it is possible to prevent an undesirable scaly asperity from being formed on a surface of the nitride semiconductor layer formed on the buffer layer.

The thickness of the semiconductor buffer layer made of AlN is selected in a range of 10 nm to 250 nm. In the case of less than 10 nm, the effect of the semiconductor buffer layer is insufficient and the scaly asperity exists on the surface of the nitride semiconductor layer formed on the semiconductor buffer layer. In the case of larger than 250 nm, film quality of the nitride semiconductor layer formed on the semiconductor buffer layer becomes bad, and a crystal layer as the nitride semiconductor layer formed on the semiconductor buffer layer, which crystal layer is formed above a crystal plane of the substrate via the semiconductor buffer layer, degrades.

Therefore, by the use of the invention, a device such as a light emitting diode produced on the $ZrB_2$ single crystal substrate can be produced on a smooth plane, and a char-acteristic and the yield thereof are increased. The thickness of the semiconductor buffer layer is so selected as to become thinner than the thickness of a crystal layer made of nitride semiconductor formed on the semiconductor buffer layer first.

In the invention, the substrate is eroded and removed by etching.

Further, the invention provides a method for producing a semiconductor apparatus, comprising:

eroding and removing a diboride single crystal substrate of a semiconductor apparatus obtained by the aforementioned method for growing nitride semiconductors by etching.

Further, the invention provides a method for producing a semiconductor apparatus, comprising the steps of:

carrying out crystal growth of a nitride semiconductor layer on one principal surface of a single crystal substrate of a hexagonal crystal symmetry having electrical conductivity; and eroding and removing the single crystal substrate by etching.

In the invention, the single crystal substrate is a substrate of a diboride single crystal expressed by $XB_2$, in which X includes at least one of Zr and Ti.

In the invention, in growing the nitride semiconductor layer from vapor phase, a nitride semiconductor layer grown firstly is an $Al_xGa_{1-x}N$ layer ($0<x\leq1$).

In the invention, a mixed solution of at least nitric acid and hydrofluoric acid is used for the etching.

As described above, according to a method for producing a semiconductor apparatus of the invention, by going through the step of carrying out crystal growth of a nitride semiconductor layer on one principal surface of a single crystal substrate of a hexagonal symmetry structure having electrical conductivity, and the step of eroding and removing the single crystal substrate by etching, it is possible to avoid a warp and cracks of the semiconductor apparatus, decrease dislocation density, curve dislocation, prevent inclination of crystal orientation in a horizontal direction of the semiconductor apparatus, and thereby provide a nitride semiconductor apparatus in which in-plane uniformity of dislocation density is good.

BRIEF DESCRIPTION OF THE DRAWINGS

Other and further objects, features, and advantages of the invention will be more explicit from the following detailed description taken with reference to the drawings wherein:

FIG. 9 is a view showing of photographs of surfaces of GaN films;

DETAILED DESCRIPTION

Figure 1:
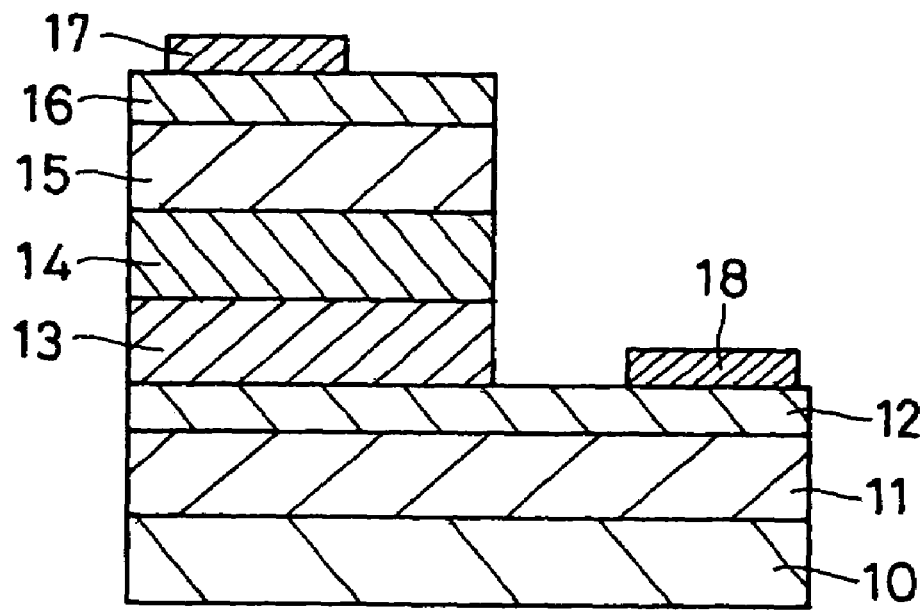
FIG. 1 is a sectional view schematically explaining a semiconductor apparatus of the invention.

Now referring to the drawings, preferred embodiments of the invention are described below.

Figure 2:
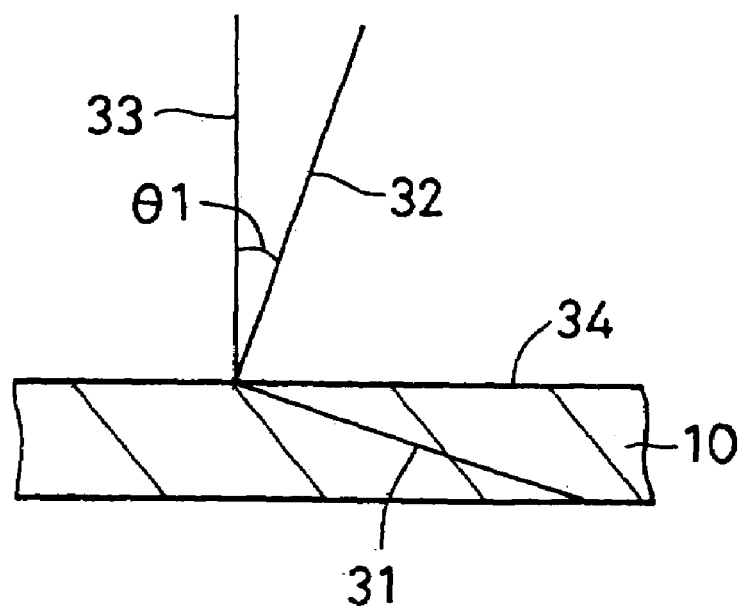
FIG. 2 is a sectional view showing a diboride single crystal substrate (chemical formula $XB_2$) of the semiconductor apparatus shown in FIG. 1.

FIG. 1 is a sectional view showing a semiconductor apparatus according to one embodiment of the invention. FIG. 2 is a sectional view showing a diboride single crystal substrate (chemical formula XB$_2$) 10 of semiconductor apparatus shown in FIG. 1. A normal line of a principal surface 34 of the substrate 10 is inclined with respect to a crystal axis 32 which is a [0001] axis perpendicular to a (0001) plane 31 of the substrate 10, by an angle θ1, which is larger than or equal to 0° and less than or equal to 5° (0°≦θ1≦5°). That is, it is preferable that the diboride single crystal substrate (chemical formula XB$_2$) 10 of the present invention is the substrate 10 such that the (0001) plane 31 or a plane obtained by inclining the (0001) plane 31 by 0° or more and 50 or less in an arbitrary direction is defined as the principal surface 34. In order to make crystalline quality of a nitride semiconductor layer 11 through 16 grown on the substrate 10 to be fine, and obtain a semiconductor apparatus which has a more excellent characteristic, an angle θ1 formed by a normal line 33 of a principal surface 34 of the substrate and a normal line 32 of the (0001) plane 31 is set to 0° or more and less than 1.7° (0°≦θ1<1.7°). Preferably, the angle is set to 0° or more and less than 0.7° (0°≦θ1<0.7°). Further, a (01-10) plane, a (11-20) plane, a (01-12) plane and so on, other than the (0001) plane, can also be used as the growth principal plane. Symbol '-' of '-1' and '-2' by Miller index expression represents an inverse (bar) symbol, and the same applies in the following description.

In specific, TiB$_2$ and ZrB$_2$ wherein X is Ti and Zr have differences in lattice constant of 2% or less in any composition of the nitride semiconductor made of Al, Ga and N which are elements constituting the semiconductor buffer layer. For example, in a semiconductor apparatus in which the nitride semiconductor is AlN and the substrate is constituted by ZrB$_2$, referring to Table 1 mentioned above, the difference in lattice constant is (3.1696−3.1114)/3.1114=1.9%. Thus, they become a combination of extremely high matching. The lattice constant of the nitride semiconductor containing Al or Ga and N, namely, Al$_y$Ga$_{1-y}$N (0<y≦1), is in a range of 3.1114 to 3.1860 with reference to Table 1 mentioned above. According to the invention, it is enough that at least one of the elements of Ti and Zr on diaboride single crystal substrate is contained, and both the elements of Ti and Zr may be contained.

Figure 3A:
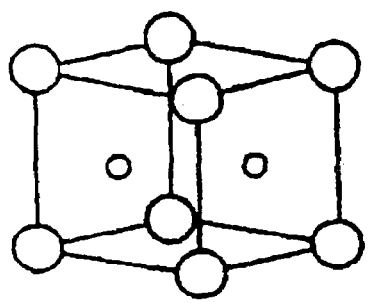
FIGS. 3A and 3B are crystal structural views of $XB_2$ respectively.
Figure 3B:
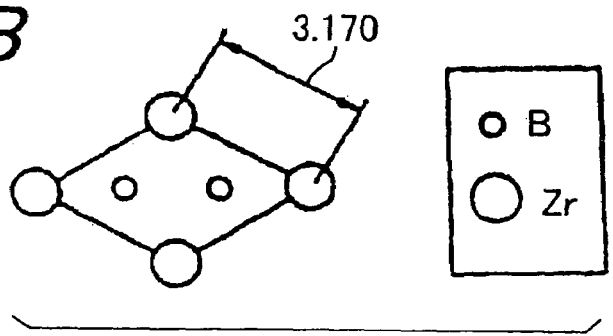
Figure 4A:
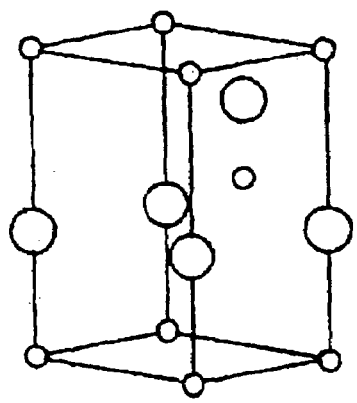
FIGS. 4A and 4B are crystal structural views of $XB_2$ respectively.
Figure 4B:
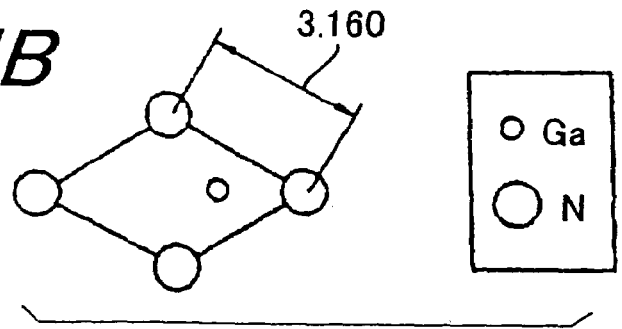

A crystal structure of XB$_2$ is a hexagonal symmetry structure referred to as an AlB$_2$ structure as shown in FIGS. 3A, 3B. This structure is similar to a wurtzite structure of a GaN crystal shown in FIGS. 4A, 4B. In specific, regarding a match relation of crystal lattice between the (0001) plane of an XB$_2$ crystal of Ti or Zr and GaN or AlN, as shown in Table 1, a difference in lattice constant between TiB$_2$ or ZrB$_2$ and GaN or AlN is 2% or less in any combination, and therefore, they can be considered as a combination of extremely high matching.

For forming semiconductor buffer layer in crystal growth, a molecular beam epitaxy (MBE) method, a metalorganic vapor phase epitaxy (MOCVD) method, a hydride vapor epitaxy (HVPE) method, a sublimation method and the like are used. Moreover, it is possible to appropriately combine the aforementioned growing methods as well. For example, it is possible to use the MBE method, by which it is possible to grow while controlling a surface morphology, for initial epitaxy growth, and use the HVPE method, by which it is possible to grow at high speeds, for a thick GaN thin film required.

Next, after a buffer layer 11 is formed, a nitride semiconductor which contains a 13 group (former IIIB group) element to be aimed is formed. Here, crystal growth of the nitride semiconductor is carried out at growth temperatures of 700° C. to 900° C. At this moment, B, which is a main element contained in the diboride single crystal substrate 10, diffuses from a substrate side into the nitride semiconductor of the buffer layer 11.

In the invention, a semiconductor buffer layer composed of at least AlGaN is used as the buffer layer 11. In the nitride semiconductor, an interatomic distance of AlN is smaller than interatomic distances of InN and GaN. Therefore, crystal bond in AlN is stronger than those in InN and GaN, and diffusion of B from the diboride single crystal substrate in AlN is less than in InN and GaN.

Further, as shown in aforementioned Table 1, InN and InGaN largely mismatch with the diboride single crystal substrate in lattice constants, and therefore, in the case of using InN and InGaN as the buffer layers and carrying out crystal growth directly on the substrate, a lattice defect or the like occurs. On the contrary, in the invention, it is preferable since AlGaN matches with the diboride single crystal substrate in lattice constants.

Further, in specific, the nitride semiconductor containing the 13 group element contains one or more selected from among Ga, Al, In, B and Ti and moreover may contain As which is the 15 group element.

Regarding the diboride single crystal, assume one or more kinds of impurity elements selected from among Cr, Hf, V, Ta and Nb, which are 4 group to 6 group (former IVA group to VIA group) elements, are solid solutions of 5 atom % or less. This is because when the impurity elements are more than 5 atom %, a value of physical property shown in Table 1 and a value of specific resistance of the substrate vary, which is not preferable. It is possible by containing Cr of 5 atom % or less to expect an effect of inhibiting growth of crystal grains of the nitride semiconductor layer, and therefore, it is preferable for forming a good layer without occurrence of cracks or the like.

In this way, according to the invention, it is possible to avoid diffusion of B, which is a main element contained in the diboride single crystal substrate, and formation of a nitride semiconductor containing B on an interface between the substrate and the nitride semiconductor, and it is possible to obtain a good quality nitride semiconductor with a small lattice defect, and thus, it is possible to obtain a semiconductor device which has an excellent characteristic.

Besides, a nitride semiconductor apparatus (a light emitting diode) which contains the 13 group element shown in FIG. 1 will be described as an embodiment of the invention.

A GaN layer is grown on the (0001) plane of a substrate 10 of $ZrB_2$ by the molecular beam epitaxy (MBE) method. On a $ZrB_2$ single crystal substrate 10 of the (0001) plane orientation, AlGaN of a buffer layer 11, which is a semiconductor buffer layer, and crystal growth of nitride semiconductor 12 through 16 to be aimed is carried out on the buffer layer 11 by the MBE method in order. In high vacuum, a temperature of the $ZrB_2$ substrate 10 is increased to 800° C., and an Al molecular beam, a Ga molecular beam and active nitrogen supplied from a high-frequency excitation plasma cell are supplied to start crystal growth.

Here, one conductive type, which is one of p type and n type, of semiconductor contact layer 12 on the buffer layer 11 is made of n-GaN, for example. The one conductive type of semiconductor contact layer 12 contains approximately $1 \times 10^{17}$ to $10^{19}$ atoms/cm$^3$ of one conductive type of semiconductor impurity, such as silicon. Furthermore, a one conductive type of semiconductor layer 13 on the layer 12 is a cladding layer made of n-AlGaN, for example. Moreover, a one conductive type of semiconductor layer 13 contains approximately $1 \times 10^{16}$ to $10^{19}$ atoms/cm$^3$ of one conductive type of semiconductor impurity, such as silicon.

A light emitting layer 14 is formed on the layer 13 and made of GaN, InGaN or the like. Here, the light emitting layer 14 may have a quantum well structure, a quantum thin line structure or a quantum dot structure.

A reverarcseconductive type, which is the other of p type and n type, of semiconductor layer 15 is formed on the layer 14 and is a cladding layer made of p-AlGaN or the like, and contains approximately $1 \times 10^{16}$ to $10^{19}$ atoms/cm$^3$ of impurity which changes into a reverarcseconductive type, such as Mg or Zn. Here, this layer may contain a small amount of one or more selected from among In, P, As and the like.

A reverarcseconductive type of semiconductor contact layer 16 is formed on the layer 15 is made of $ZrB_2$, for example, and contains approximately $1 \times 10^{19}$ to $10^{20}$ atoms/cm$^3$ of impurity which changes into a reverarcseconductive type, such as Mg or Zn. A portion from the layer 16 to an upper region of the layer 12 is partly etched and removed.

Thereafter, one conductive type of electrode 18 on the layer 12 is made of one or more selected from among Au, Al, Cr, Ti and Ni. Moreover, a reverarcseconductive type of electrode 17 on the layer 16 is made of one or more selected from among Au, Al, Cr, Ti and Ni as well.

In this way, this embodiment also realizes an excellent semiconductor apparatus with a small lattice defect, by which a good characteristic can be expected. Here, a layer structure of the semiconductor apparatus is not restricted to the structure shown in FIG. 1, and it may be a structure such that nitride semiconductor layers 112 to 117 are formed on one principal surface of a substrate 118 such as FIG. 8 described-after, one electrode 111 is formed on the nitride semiconductor layer 112 and another electrode 119 is formed on another principal surface of the substrate 118.

Next, in the respective embodiments in FIGS. 1 to 4, the result of a study of the principal surface 34 of the substrate 10 for preferably growing the nitride semiconductor layer and a most suitable crystal plane 31 will be described.

Step 1A:

Firstly, several kinds of $ZrB_2$ single crystal substrates 10 which have different off angles (angles θ1 formed by the normal line 33 of the principal surface 34 of the substrate 10 and the normal line 32 of the (0001) plane 31) were prepared. The surface of $ZrB_2$ was cleansed by the use of an alkali solvent.

Step 2A:

Before the nitride semiconductor was grown, the substrate 10 was heated for three minutes in a hydrogen ($H_2$) atmosphere (1 air pressure), and annealed at 1150° C. for one minute.

Step 3A:

After that, temperature was decreased for five minutes, and an AlGaN layer serving as a semiconductor buffer layer 11 was grown. A growth temperature was 850° C. and film thickness was 20 nm at that moment. Further, ammonia ($NH_3$), trimethylaluminum (TMAI) and trimethylgallium (TMGa) were used as source gases, the amounts of supplied $NH_3$, TMAI and TMGa were 0.07 mol/min, 8 µmol/min and 11 µmol/min, respectively, and 7 slm of $H_2$ was flown as a carrier gas. $NH_3$ was supplied from one minute before supply of TMA.

Step 4A:

Next, the temperature was increased to 1150° C., and GaN serving as the nitride semiconductor layer 12 was grown to thickness of approximately 3 µm. $NH_3$ and TMGa were used as source gases, and the amount of supplied TMGa and $NH_3$ were 44 µmol/min and 0.07 mol/min, respectively. Moreover, 3 slm of $H_2$ was flown as a carrier gas.

Figure 5:
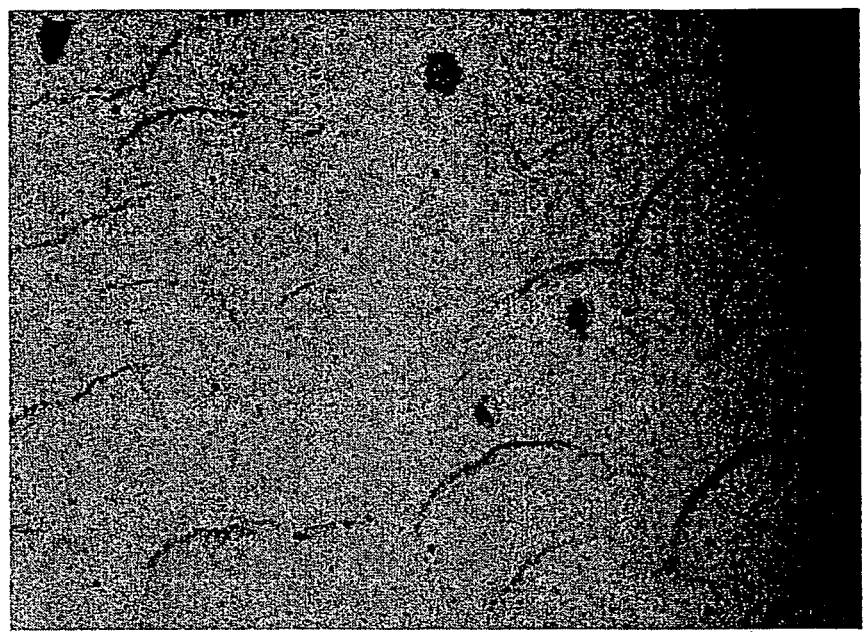
FIG. 5 is a view showing a surface morphology B of GaN film.
Figure 6:
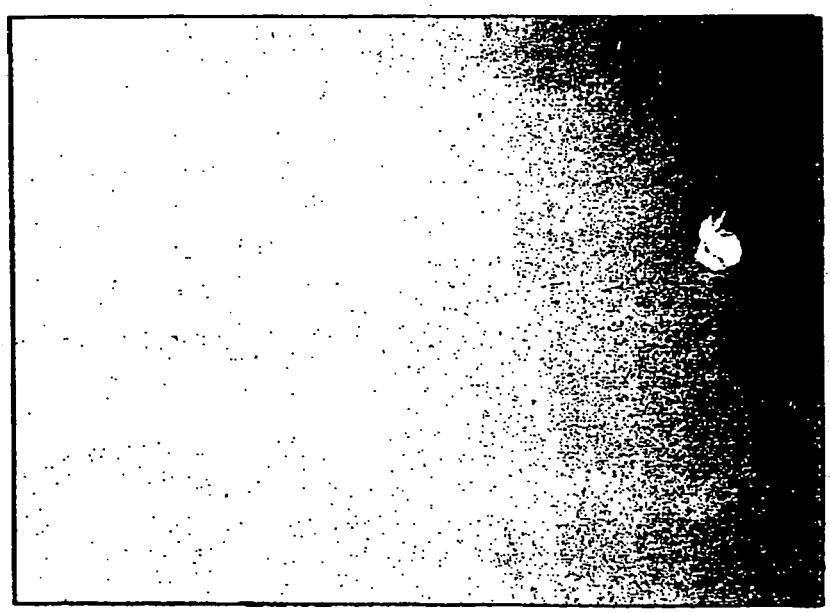
FIG. 6 is a view showing a surface morphology A of GaN film.

In microscopic observation of surfaces of the GaN films 12 after growth, surfaces with much unevenness as shown in FIG. 5 (surface morphology B) and surfaces of smooth states as shown in FIG. 6 (surface morphology A) were observed, respectively.

Figure 7:
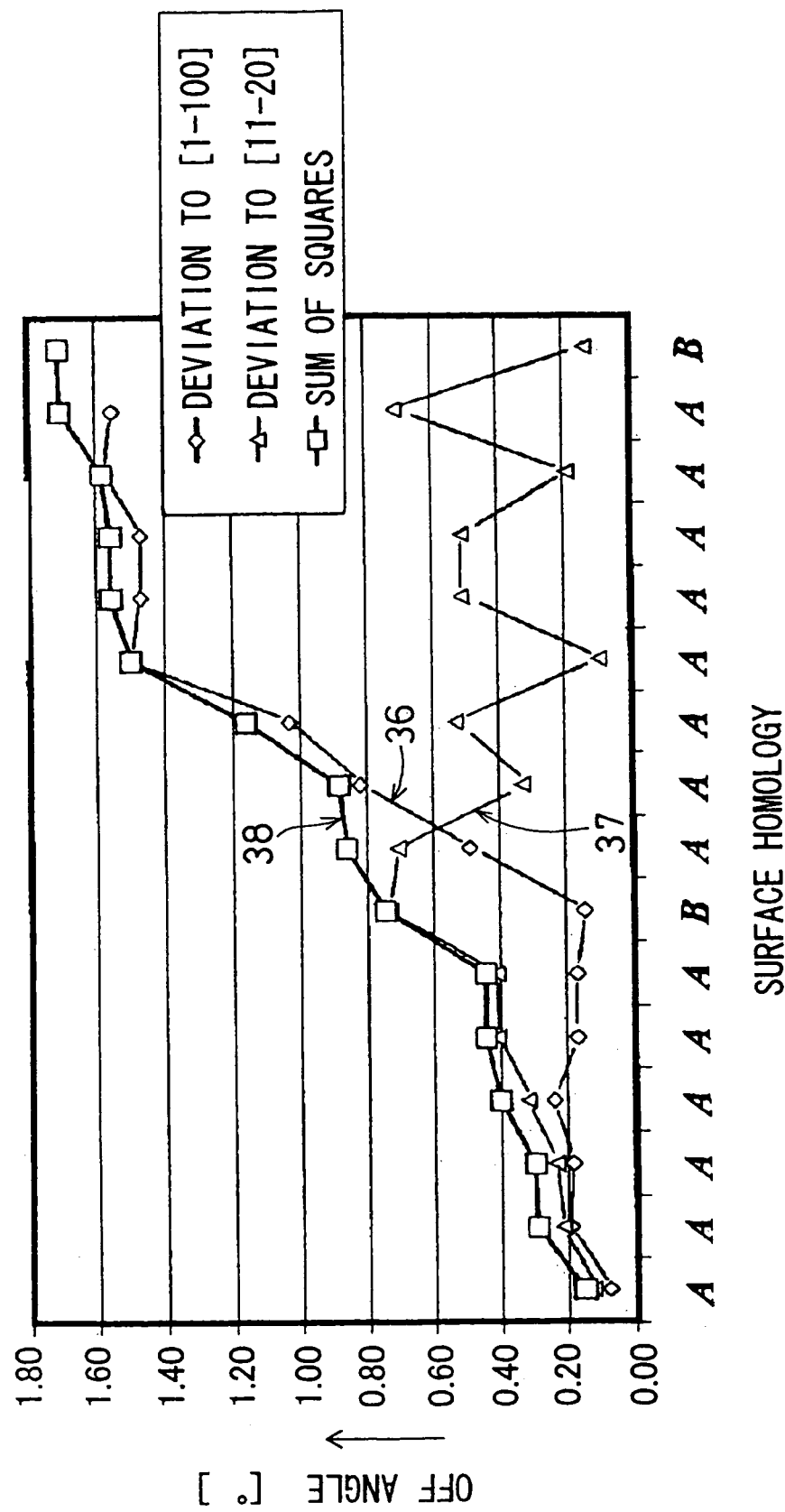
FIG. 7 is a graph showing a relation between an angle formed by a normal line of a principal surface of the substrate and a normal line of the (0001) plane and a surface morphology.

A relation between the off angles of the $ZrB_2$ single crystal substrates 10 and the surface morphologys of the grown films is shown in FIG. 7. Here, an angle θ2 of deviation from a [0001] crystal axis 32 of the normal line 33 of the surface 34 of the substrate 10 in the [10-10] direction, an angle θ3 of deviation of the same in the [11-20] direction, and the sum of squares of these deviation angles ($=\theta2^2+\theta3^2$) are shown by the lines 36, 37 and 38, respectively. All substrates that the sums of squares of the deviation angles were less than 0.7° kept good surface morphologys of the surface morphology A.

Regarding substrates that the sums of squares of the deviation angles were 0.7° or more and less than 1.7°, both the surface morphology A and the surface morphology B were observed. It can be concluded that this results from variation of operations in the growth experiment and states of the device, and it is believed that the surface morphology A can be reproduced by reducing the variation. In the case of substrates that the sums of squares of the deviation angles were 1.7° or more, almost all of the substrates kept the surface morphology B.

From these results, it became clear that in order to grow a nitride semiconductor layer containing one or more selected from among 13 group elements in a suitable crystal state and thus obtain a semiconductor apparatus which is excellent in a characteristic such as the efficiency of light emission, it is more desirable to make an angle θ1 formed by the normal line 33 of the principal surface 34 of the substrate 10 and the normal line 32 of the (0001) plane 31 to be 0° or more and less than 1.7°, and that in the case of forming a good quality nitride semiconductor layer, a crystal angle of the principal surface of the substrate has the aforementioned allowance range.

Although (1) a GaN growth layer is formed by the use of a $ZrB_2$ substrate in the aforementioned embodiment, it is also possible to form a nitride semiconductor layer containing a 13 group element, such as a GaN growth layer, on (2) a single crystal substrate made of $TiB_2$ or (3) a single crystal substrate formed of solid solutions of $ZrB_2$ and $TiB_2$ in the same manner as described above, and it is possible to appropriately change and embody the invention within the scope of the invention.

The steps in the invention will be sequentially described below.

Figure 8:
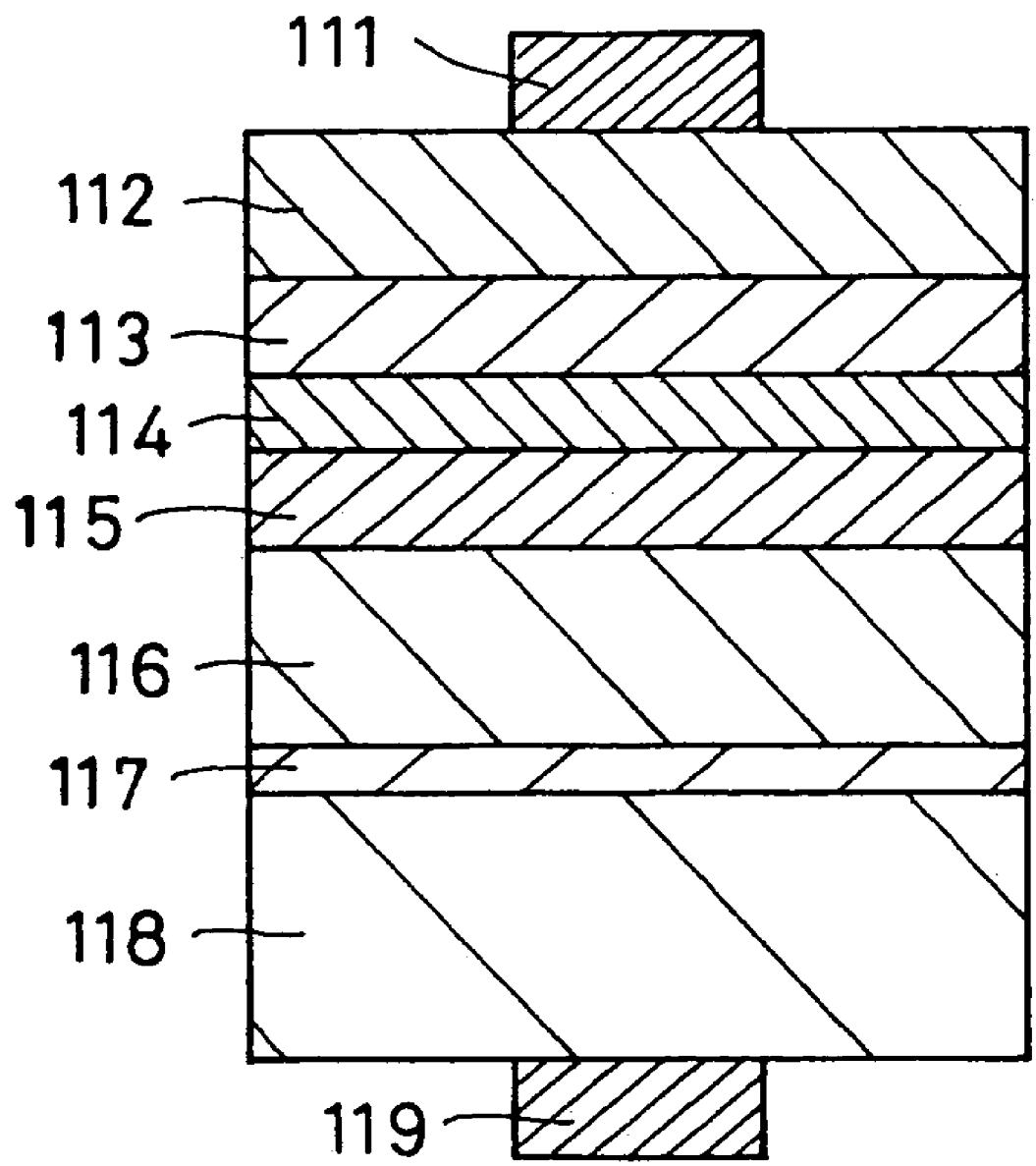
FIG. 8 is a schematically sectional view of the semiconductor apparatus in which a nitride semiconductor layer is formed on a ZrB$_2$ single crystal substrate.

FIG. 8 is a sectional view showing a semiconductor apparatus of a light emitting diode according to another embodiment of the invention.

According to the invention, a diboride single crystal substrate 118 expressed by a chemical formula $XB_2$ is used, in which X contains at least one of Ti, Zr, Nb and Hf.

This substrate 118 can be to a $ZrB_2$ substrate, a $TiB_2$ substrate or a $Zr_xTi_{1-x}B_2$ substrate, however, a method for carrying out vapor phase growth on the $ZrB_2$ substrate by the MOVPE method will be described in this embodiment.

Step 1B:

The $ZrB_2$ substrate 118 is cleansed by the use of an alkali solvent.

Step 2B:

Before growth of a nitride semiconductor, the $ZrB_2$ substrate 118 is heated for three minutes in a hydrogen ($H_2$) atmosphere (1 air pressure), and annealed at a temperature of 1150° C. for one minute.

Step 3B:

After that, temperature was decreased for about five minutes, and an $(AlN)_x(GaN)_{1-x}$ buffer layer 117 is deposited.

It is good to set a growth temperature T within a temperature range of 400° C.<T<1100° C. at this moment, and then grow the $(AlN)_x(GaN)_{1-x}$ layer (0<x≦1.0) from vapor phase as the buffer layer 117.

Further, it is good to set thickness of the $(AlN)_x(GaN)_{1-x}$ layer 117 within a range of 10 to 100 nm. According to such vapor phase growth, used source gases are ammonia ($NH_3$), trimethylaluminum (TMA) and trimethylgallium (TMG), the amounts of supplied TMA and TMG are, for example, 7 μmol/min and 11 μmol/min, respectively, and 7 slm of $H_2$ is flown as a carrier gas. 0.07 mol/min of $NH_3$ is supplied from one minute before supply of TMA and TMG.

Step 4B:

Next, the substrate is heated to 1150° C., for example, and an n-GaN contact layer 116 is grown to approximately 3 μm by the MOVPE method, for example. Used source gases are $NH_3$ and TMG, and the amounts of supplied TMG and $NH_3$ are, for example, 44 μmol/min and 0.07 mol/min, respectively. 3 slm of $H_2$ is flown a carrier gas.

Further, a cladding layer 115 made of n-AlGaN, a light emitting layer 114 made of GaN, InGaN or the like, a cladding layer 113 made of p-AlGaN, a contact layer 112 made of p-GaN and a p-electrode 111 are formed, and an n-electrode 119 is formed on a back surface of the substrate 118.

In the case of using the $ZrB_2$ single crystal substrate 118, since such a structure that one electrode 119 is arranged on the back surface of the substrate 118 is possible, there is an advantage that device area can be reduced.

Next, an experimental example which was carried out by the inventors will be described.

Although the aforementioned steps 1B to 4B were executed sequentially, according to the example, a deposition temperature was changed among 400° C., 725° C., 850° C. and 1100° C. and film thickness was changed among 10 nm, 20 nm, 50 nm and 80 nm at step 3B, whereby various kinds of samples were produced.

Source gases were ammonia ($NH_3$), trimethylaluminum (TMA) and trimethylgallium (TMG), the supply amounts of TMA and TMG were 7 μmol/min and 11 μmol/min, respectively, and 7 slm of $H_2$ was flown as a carrier gas. 0.07 mol/min of $NH_3$ was supplied from one minute before supply of TMA and TMG. Next, at step 4B, the substrate was heated to 1150° C. and GaN was grown to approximately 3 μm. Used source gases were $NH_3$ and TMG, and the amounts of supplied TMG and $NH_3$ were 44 μmol/min and 0.07 mol/min, respectively. 3 slm of $H_2$ was flown as a carrier gas.

The results of the experiment on the various kinds of samples obtained by changing the deposition temperature and the film thickness at step 3B as described above are shown in FIG. 9.

FIG. 9 shows photographs of surfaces of GaN films in the case of growing the $(AlN)_x(GaN)_{1-x}$ layer 117 at temperatures of 400° C. or less, 850° C., and 1100° C. or more.

Further, a value of x, and a rocking curve FWHM (TILT) of (0002) plane omega scan by an X-ray diffraction method are shown on the right of description of the temperature given in each of the FIG. 9 (refer to Table 2)

The value of x is data obtained by measuring the $(AlN)_x(GaN)_{1-x}$ films grown under the same condition, by an EDX method.

TABLE 2

| FIG. 9 | Working example/ Comparative example | Deposition temperature T (° C.) | x | FWHM (TILT) (arcseconds) |
|---|---|---|---|---|
| (1) | Comparative example 1 | 400 or less | 0.8 | — |
| (2) | Working example 1 | 725 | 0.6 | 760 |
| (3) | Working example 2 | 850 | 0.5 | 596 |
| (4) | Working example 3 | 925 | 0.4 | — |
| (5) | Comparative example 2 | 1100 or more | 0.25 | 873 |

As apparent from these results, the GaN film was not formed at 400° C. or less, and the GaN film had a hexagonal surface shape at 1100° C. or more. The GaN films had smooth surfaces at 850° and 725° C. Here, the rocking curve FWHM (TILT) was 1000 arcseconds or less in every case that the growth temperature T was more than 400° C. and less than 1100° C.

Figure 10:
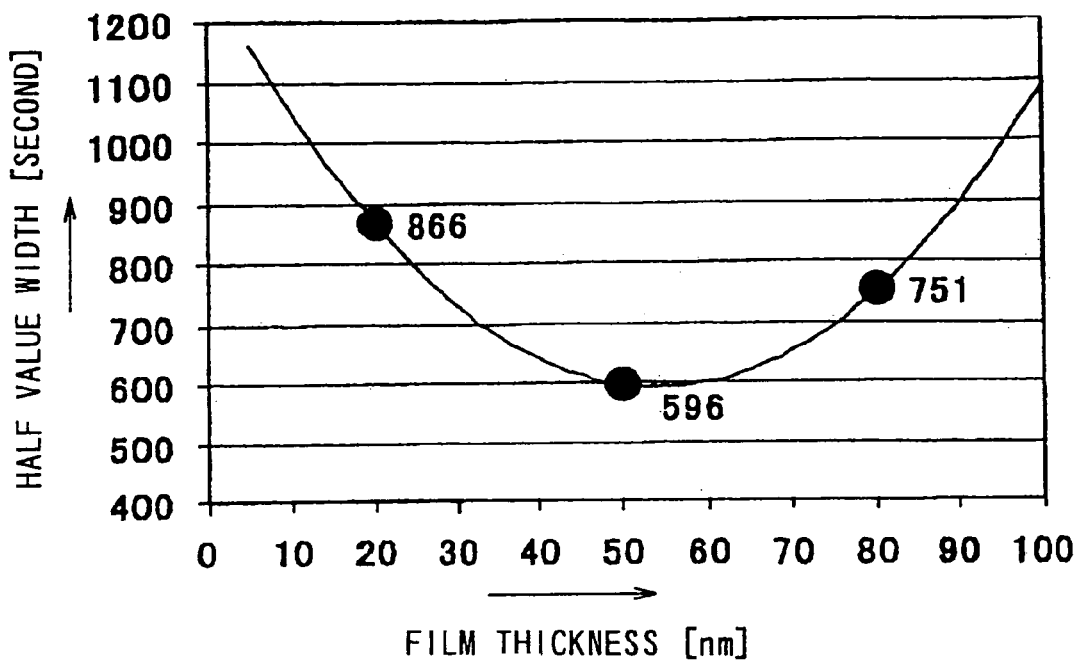
FIG. 10 is a line view showing a relation between film thickness of (AlN)$_x$(GaN)$_{1-x}$ and X-ray FWHM (TILT)
Figure 11:
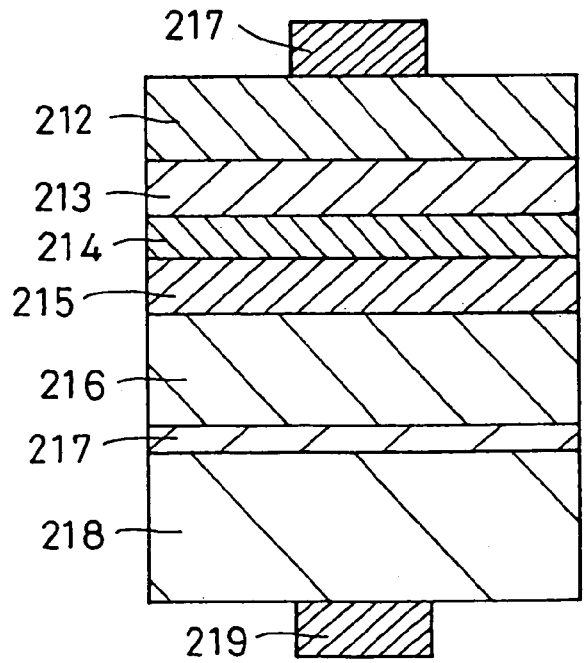
FIG. 11 is a schematically sectional view of the semiconductor apparatus in which a nitride semiconductor layer is formed on a ZrB$_2$ single crystal substrate.

A relation between film thickness of the $(AlN)_x(GaN)_{1-x}$ layer deposited at 850° C. and the rocking curve FWHM (TILT) of the (0002) plane omega scan by the X-ray diffraction method is shown in FIG. 10. In a case where the layer was grown in a setting such that the film thickness was less than 10 nm, a surface morphology thereof became the same as that at deposition temperatures 400° C. or less. It can be read from the graph that the FWHM (TILT) becomes 1000 arcseconds or less between the film thickness 10 nm and 100 nm.

Further, for comparison, in a comparative example 3, after the AlN layer was deposited on the $ZrB_2$ substrate at 600° C., GaN was grown to approximately 3 μm at 1150° C. Source gases used at the time of growing the AlN layer were NH$_3$ and TMA. The amounts of supplied TMA and NH$_3$ as the sources were 3.5 µmol/min and 0.07 mol/min, respectively, and 2slm of H$_2$ was flown as a carrier gas. Conditions other than the above were the same as those of the (AlN)$_x$(GaN)$_{1-x}$ layer. The rocking curve FWHM (TILT) of the (0002) plane omega scan by X-ray diffraction was approximately 1000 arcseconds.

Further, as a comparative example 4, instead of growing the (AlN)$_x$(GaN)$_{1-x}$ layer (0<x<1.0) from vapor phase, the GaN layer was grown at 400° C., and thereafter, according to step 4B, the temperature was increased to 1150° C. to grow the GaN layer to approximately 3 µm by the MOVPE method.

According to such vapor phase growth of the GaN layer at a deposition temperature 400° C., conditions were the same as those of the AlN layer except that the source was replaced from TMA to TMG.

As a result of production in this manner in comparative example 3, the GaN film exfoliated from the ZrB$_2$ substrate right away after growth.

Here, the invention is not restricted to the above embodiment, and can be changed and improved in various manners within the scope of the invention. For example, although the ZrB$_2$ substrate was used as the diboride single crystal substrate, it was confirmed by an experiment that, in place of the above substrate, a substrate such that a chemical formula is XB$_2$ and X is Ti, Nb or Hf or a combination thereof also takes the operations and effects of the invention.

According to the invention, a diboride single crystal substrate 218 expressed by a chemical formula XB$_2$ is used, in which X contains at least one of Ti, Zr, Nb and Hf. This substrate 218 can be to a ZrB$_2$ substrate, a TiB$_2$ substrate or a Zr$_x$Ti$_{1-x}$B$_2$ substrate, however, a method for carrying out vapor phase growth on the ZrB$_2$ substrate 218 by the MOVPE method will be described in this embodiment.

Step 1C:
The ZrB$_2$ substrate 218 is cleansed by the use of an alkali solvent.

Step 2C:
Before growth of a nitride semiconductor layer 217, the ZrB$_2$ substrate 218 is heated for three minutes in a hydrogen (H$_2$) atmosphere (1 air pressure), and annealed at a temperature of 1150° C. for one minute.

Step 3C:
After that, temperature is decreased for about five minutes, and an AlN layer 217 which is low temperature buffer layer is deposited.

At this moment, it is good to set a growth temperature T within a temperature range of 800° C. or less, and grow the AlN layer 217 from vapor phase. Here, in the present embodiment, the temperature is set to 600° C. Further, it is good to set the thickness of the AlN layer 217 within a range of 10 nm to 250 nm. Here, in the embodiment, the thickness is set to 20 nm.

According to such vapor phase growth, ammonia (NH$_3$), trimethylaluminum (TMA) and trimethylgallium (TMG) are used as source gases, the amounts of supplied NH$_3$ and TMA are, for example, 0.07 mol/min and 3.5 µmol/min, respectively, and 4 slm of H$_2$ is flown as a carrier gas. NH$_3$ is supplied from one minute before supply of TMA.

Step 4C:
Next, the substrate is heated to 1150° C., for example, and a p-GaN contact layer 216 is grown to approximately 3 µm by the MOVPE method, for example. Used source gases are NH$_3$ and TMG, and the amounts of supplied TMG and NH$_3$ are, for example, 44 µmol/min and 0.07 mol/min, respectively. 3 slm of H$_2$ is flown a carrier gas.

A cladding layer 215 made of n-GaN, a light emitting layer 214 made of InN, InGaN or the like, a cladding layer 213 made of p-GaN, a contact layer 212 made of p-GaN are formed on the p-type contact layer 216 in this order, and a p electrode 211 are further formed. An n electrode 219 is formed on a back surface of the substrate 218.

Figure 13:
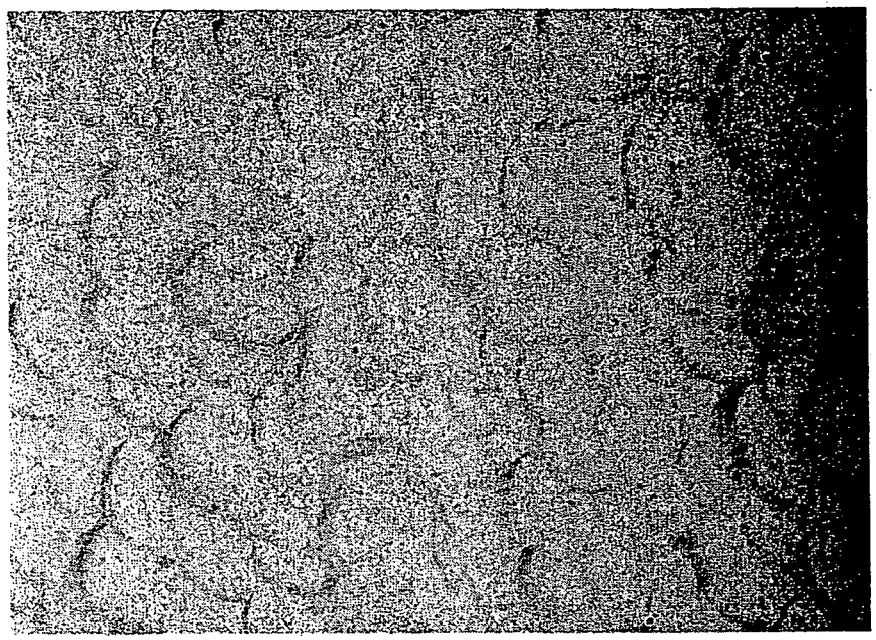
FIG. 13 is a view showing a surface morphology (surface morphology B) of GaN film.
Figure 14:
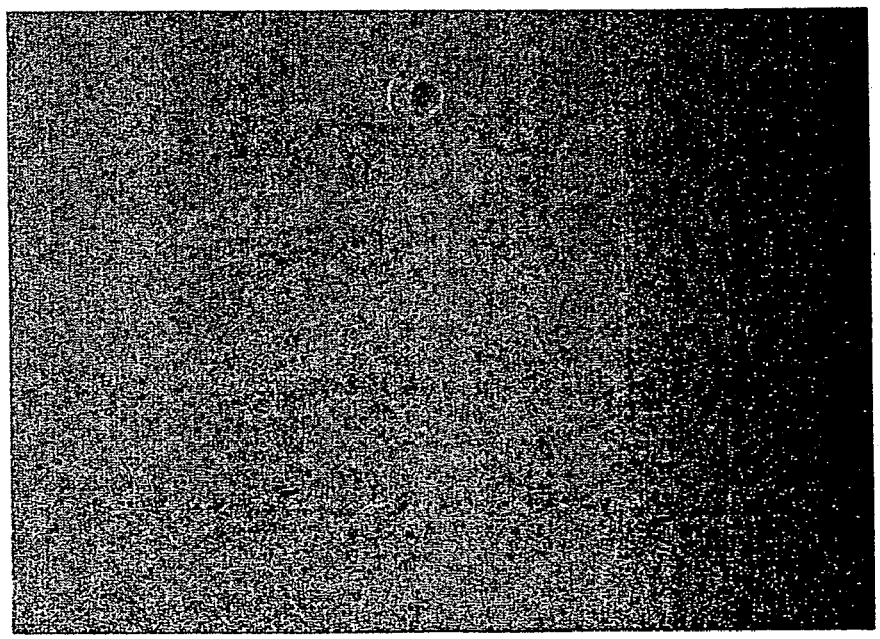
FIG. 14 is a view showing a surface morphology (surface morphology A) of GaN film according to the invention.

In observation of surfaces of the GaN films 216 after growth, an uneven surface as shown in FIG. 13 (surface morphology B) and a smooth surface as shown in FIG. 14 (surface morphology A) are observed.

Figure 12:
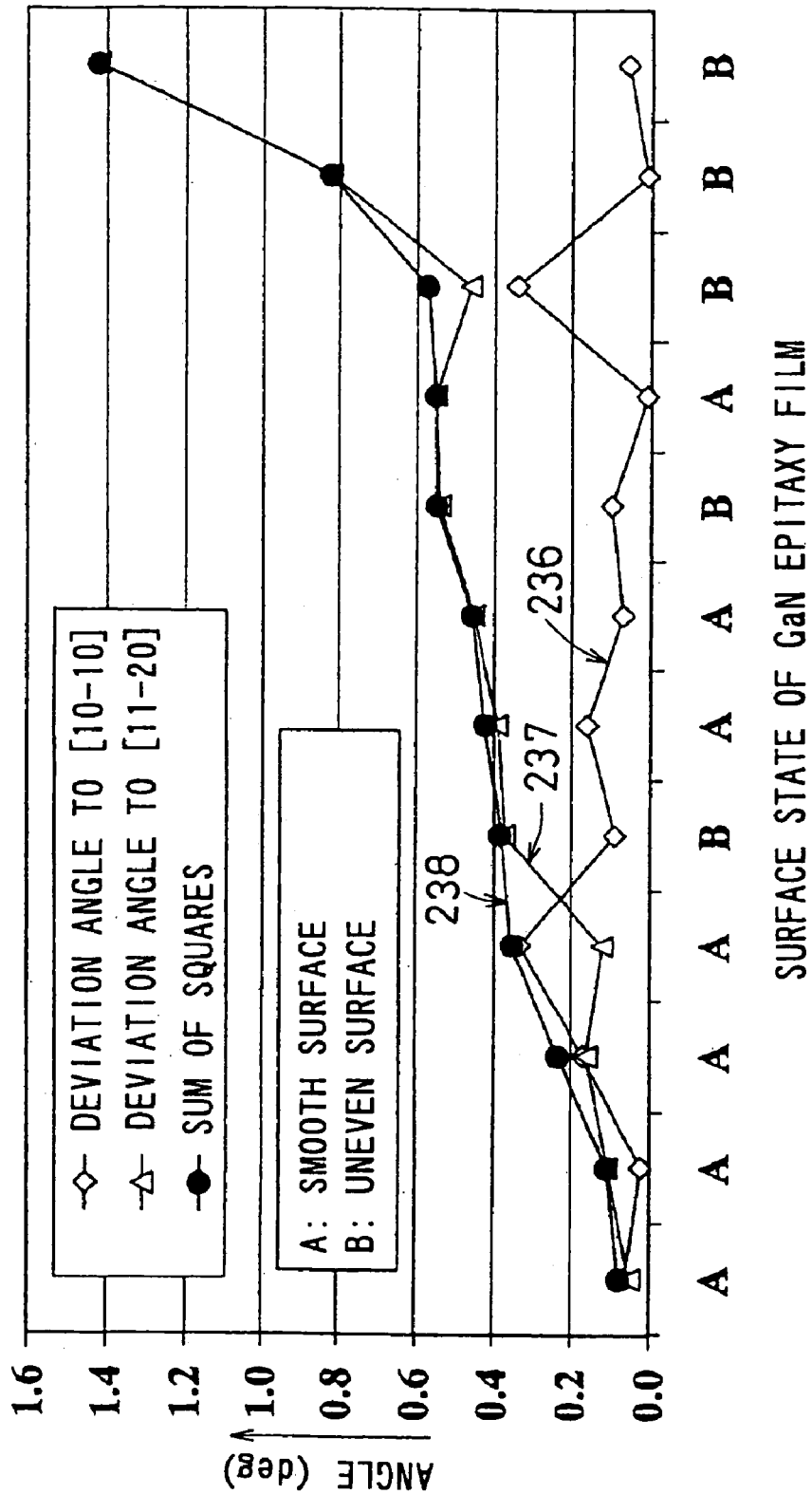
FIG. 12 is a line view showing a relation between an off angle of a substrate surface and surface morphology.

Then, a relation between an off angle θ1 of the ZrB$_2$ single crystal substrate 218 and a surface morphology of the grown film is shown in FIG. 12. Here, an angle θ4 of deviation of a normal line 33 (refer to aforementioned FIG. 12) on a surface of a substrate 218 from a [0001] crystal axis 32 in the [10-10] direction, an angle θ5 of deviation of the same in the [11-20] direction, and the sum of squares (=θ4$^2$+θ5$^2$) thereof are shown by lines 236, 237 and 238 in FIG. 12, respectively. All substrates that the sums of squares of the off angle are 0.35 degrees or less keep the surface morphology A. In the case of substrates that the sum of squares of the off angles are between 0.35 degrees and 0.55 degrees, both the surface morphology A and the surface morphology B are observed. It can be concluded that this results from variation of operations in the growth experiment and states of the device, and it is believed that the surface morphology A can be reproduced by reducing the variation. All substrates that the sums of squares of the off angles are 0.55 degrees or more keep the surface morphology B.

Here, the invention is not restricted to the above embodiment, and can be changed and improved in various manners within the scope of the invention. For example, although the ZrB$_2$ substrate was used as the diboride single crystal substrate 218, it was confirmed by an experiment that, in place of the above substrate, a substrate such that a chemical formula is XB$_2$ and X is Ti, Nb or Hf or a combination thereof also takes the operations and effects of the invention.

Figure 15A:
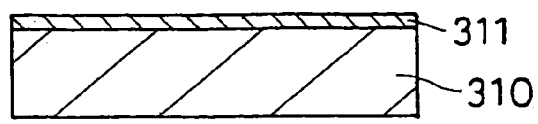
FIGS. 15A thorough 15F are process views showing a method for producing a semiconductor substrate of the invention.
Figure 15B:
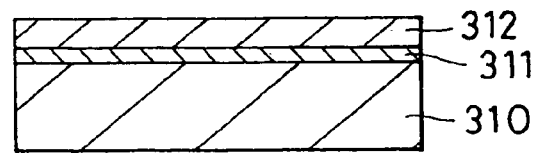
Figure 15C:
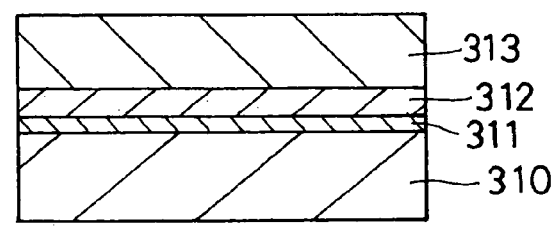
Figure 15D:
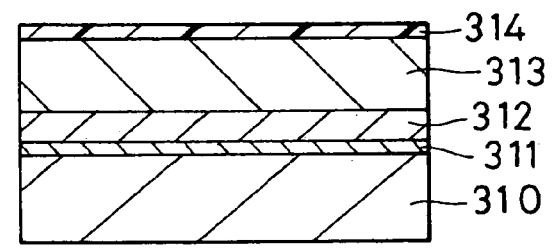
Figure 15E:
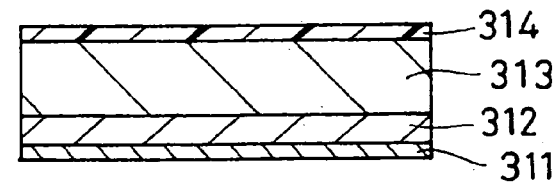
Figure 15F:
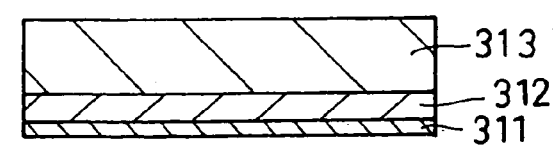
Figure 16:
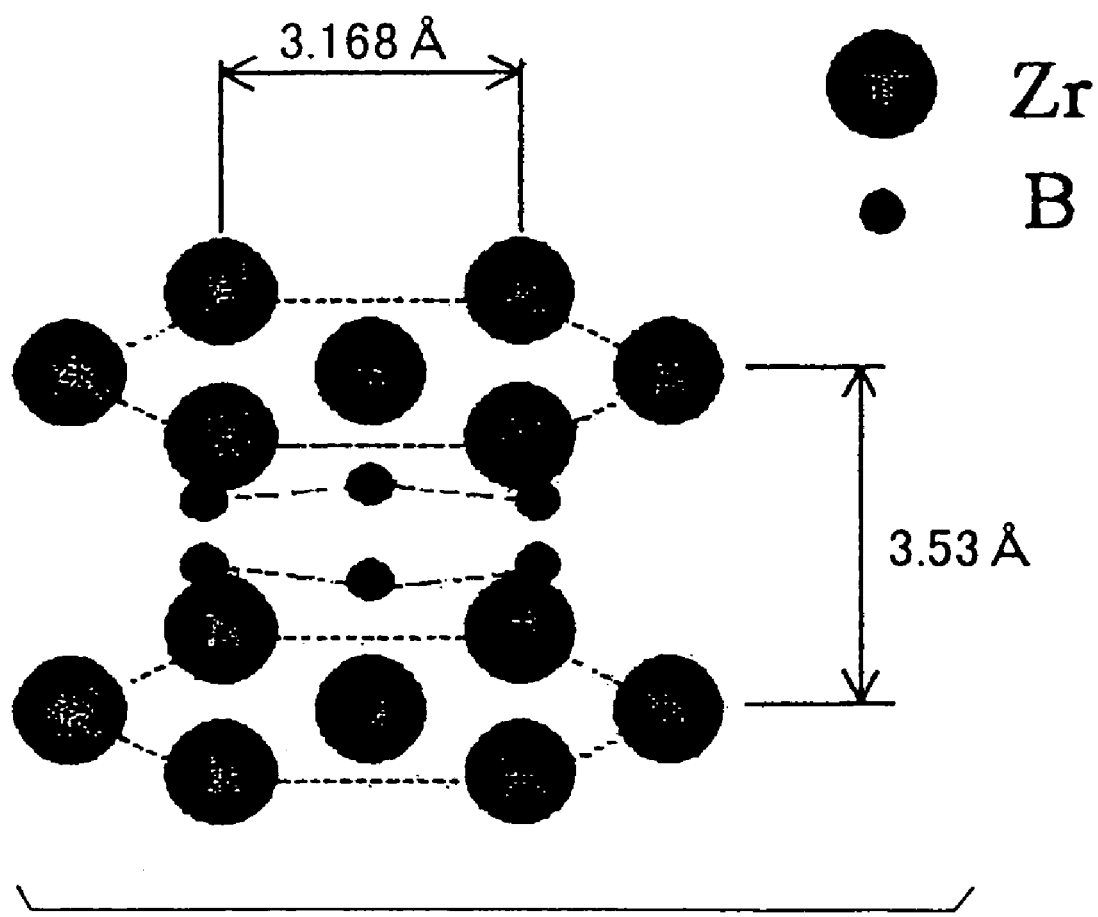
FIG. 16 is a crystal structural view of diaboride single crystal described as ZrB$_2$.
Figure 17:
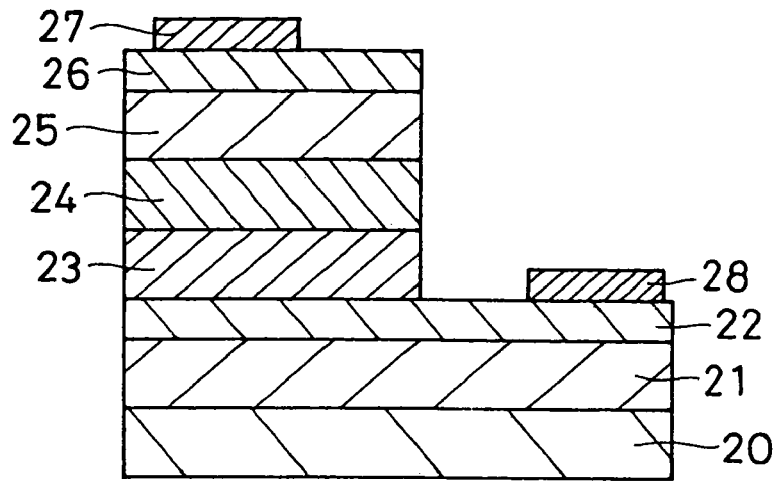
FIG. 17 is a sectional view explaining a conventional semiconductor apparatus.
Figure 18:
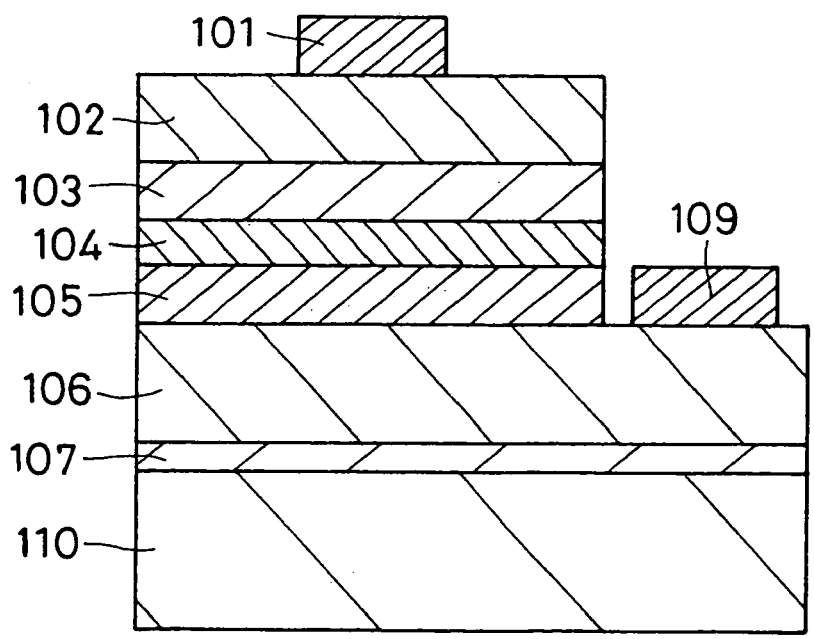
FIG. 18 is a schematically sectional view of the semiconductor apparatus in which a nitride semiconductor layer is formed on a sapphire substrate.
Figure 19A:
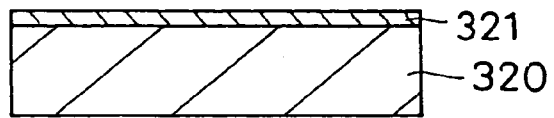
FIGS. 19A through 19F are process views showing a method for producing a conventional semiconductor substrate.
Figure 19B:
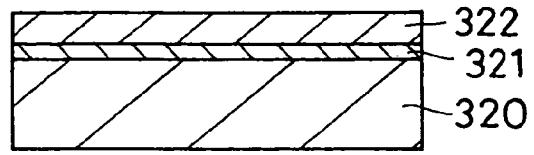
Figure 19C:
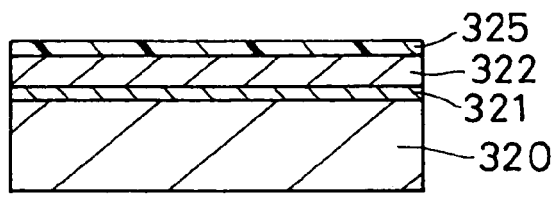
Figure 19D:
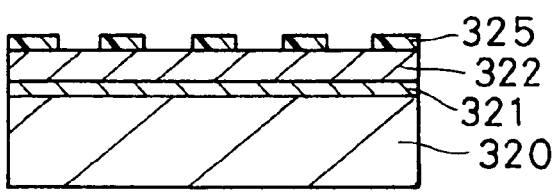
Figure 19E:
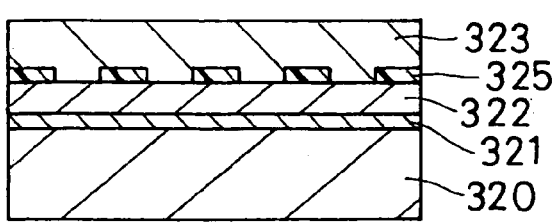
Figure 19F:
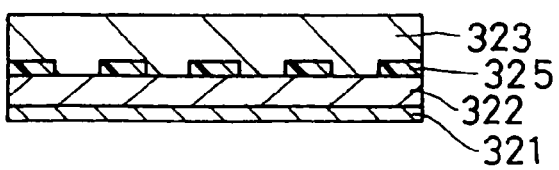

FIG. 15 is a process view showing a method for producing a nitride semiconductor device according to one embodiment of the invention, and FIG. 16 shows a crystal structure of a single crystal substrate 310 which has a hexagonal crystal symmetry.

Firstly, the step of crystal-growing a nitride semiconductor layer 313 on one principal surface of the single crystal substrate 310 will be described.

The substrate 310 used in the invention is a diboride single crystal substrate having a metallic or semimetallic characteristic whose crystal structure is a hexagonal symmetry structure.

Preferably, in the case of using a diboride single crystal substrate expressed by, for example, ZrB$_2$ as the single crystal substrate 310 is shown in FIG. 16, it is good to make the (0001) plane to be the principal surface of the substrate.

Further, as compared with an insulating material, this single crystal substrate 310 has the same level of electric conductivity as semimetal because it is a high electric conductor.

Regarding ZrB$_2$ whose lattice constant a is 3.170 Å, as compared with GaN of wurtzite structure (a lattice constant: a=3.189 Å), a ration of a lattice mismatch thereof is 0.60% (=3.189–3.170)/3.170), which is small, and a difference in the coefficient of thermal expansion is 2.7×10$^{-6}$/K, and therefore, it achieves an extremely highly matching combination, with the result that it is possible to obtain a good quality nitride semiconductor such that a lattice defect is small and stress between the substrate and the nitride semiconductor is small.

In crystal growth of the buffer layer 311, a molecular beam epitaxy (MBE) method, a metalorganic vapor Phase epitaxy (MOCVD) method, a hydride vapor phase epitaxy (HVPE) method, a sublimation method and the like are used.

Further, these growth methods may be used in combination. For example, it is possible to use the MBE method or the MOCVD method, by which it is possible to grow while controlling a surface morphology, for initial epitaxy growth, and use the HVPE method, by which it is possible to grow at high speeds, for a thick GaN thin film 311 required.

Firstly, a buffer layer 311 is formed, and then, a nitride semiconductor 312 and 313 of required layer structure are formed. The buffer layer 311 and the nitride semiconductor 312 and 313 are grown from vapor phase at growth temperatures of 600° C. to 1100° C.

According to such crystal growth, the substrate 310 is heated by thermal conduction from a susceptor heated by a heater or the like. Thermal energy from the susceptor is thermally conducted to the single crystal substrate ($ZrB_2$ substrate) 310 by thermal contact. Moreover, thermal energy is emitted as thermal radiation (infrared radiation) from the surface of the susceptor, other than by the thermal contact. The single crystal substrate 310 made of a metallic or semimetallic substrate absorbs the thermal radiation, and is heated. Being heated, Zr and B diffuse a little into the nitride semiconductor 312 and 313.

Next, the step of eroding and removing the single crystal substrate 310 by etching will be described.

By applying resist coat treatment to the whole surface of the grown GaN thick film 313 by the use of a photoresist 314, and etching with an etching solution having a selective etching characteristic together with the $ZrB_2$ substrate 310, the $ZrB_2$ substrate 310 is completely eroded. After that, by exfoliating the photoresist 314 by the use of an exfoliation solution, a semiconductor apparatus made of a GaN thick film 311, 312 and 313 are obtained.

Thus, according to the method for producing the semiconductor apparatus of the invention, by going through the steps as mentioned above, it is possible to produce a nitride semiconductor apparatus with low dislocation density and without curving dislocation, and it is possible to obtain a high quality nitride semiconductor without inclining crystal orientation in the horizontal direction of the substrate and without producing a dislocation concentrating point within the plane of the semiconductor apparatus.

Next, an embodiment of the invention such that a GaN apparatus is obtained by the use of a $ZrB_2$ single crystal substrate 310 will be described.

In the process shown in FIG. 15, steps A to F are executed sequentially.

Step 1D:

An example of forming and growing a buffer layer 311 made of GaN on a substrate 310 of the (0001) plane of $ZrB_2$ by using both the MOCVD method and the HVPE method is shown.

On the $ZrB_2$ single crystal substrate 310 of the (0001) plane orientation, a buffer layer 311 is grown from vapor phase by the MOCVD method.

As shown in FIG. 15A, the substrate 310 of the (0001) plane of $ZrB_2$ is set in an MOCVD growth furnace, and the temperature of the $ZrB_2$ substrate 310 is increased to 800° C. in a high vacuum to start crystal growth. After that, the temperature is decreased to 600° C. to grow the buffer layer 311. The buffer layer 311 is made of AlGaN, whose raw materials are trimethylaluminum (hereinafter referred to as TMA), trimethylgallium (hereinafter referred to as TMG) and ammonia gas, and grown to thickness of 0.1 μ/m.

Step 2D:

As shown in FIG. 15B, the temperature of the substrate 310 is increased to 1050° C., and a first semiconductor layer 312 is grown by the MOCVD method.

The first semiconductor layer 312 is made of GaN, whose raw materials are TMG and ammonia gas, and grown to thickness of 1 μm.

Step 3D:

The substrate 312 grown as FIG. 15B is taken out and moved into an HVPE furnace, where a arcsecond semiconductor layer 313 is grown as shown in FIG. 15C.

The HVPE method is appropriate for production of a thick film of thickness of several score μm to several hundred μm, because a growth speed in this method is higher than that in the MOCVD method. The arcsecond semiconductor layer 313 is made of GaN, whose raw sources are gallium chloride and ammonia gas, and grown to 300 μm.

Step 4D:

Then, the substrate grown as shown in FIG. 15C is taken out, and a surface of the arcsecond GaN layer 313 is spin-coated by a photoresist 314 and subjected to baking treatment as shown in FIG. 15D.

Step 5D:

After that, as shown in FIG. 15E, the $ZrB_2$ substrate 310 is completely eroded by an etching solution composed of nitric acid and hydrofluoric acid.

The etching solution composed of nitric acid and hydrofluoric acid is excellent in selectivity, because a ratio of an etching rate of GaN and an etching rate of $ZrB_2$ is 100 times or more.

Step 6D:

After that, the photoresist 314 is exfoliated by an exfoliation solution as shown in FIG. 15F, whereby a GaN semiconductor apparatus formed by a GaN thick film 313 can be obtained.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A semiconductor apparatus comprising:
 a substrate made of a diboride single crystal expressed by a chemical formula $XB_2$, in which X includes at least one of Ti, Zr, Nb and Hf;
 a semiconductor buffer layer formed on a principal surface of the substrate and made of $Al_yGa_{1-y}N$ (0<y≦1); and
 a nitride semiconductor layer formed on the semiconductor buffer layer, including at least one kind or plural kinds selected from among 13 group elements and As.

2. The semiconductor apparatus of claim 1, wherein the substrate is of $ZrB_2$ or $TiB_2$.

3. The semiconductor apparatus of claim 1, wherein the substrate is a solid solution containing one or a plurality of impurity elements of 5 atom % or less, the one or a plurality of impurity elements being selected from a group consisting of Ti, Cr, Hf, V, Ta and Nb when the substrate is of $ZrB_2$, or selected from a group consisting of Zr, Cr, Hf, V, Ta and Nb when the substrate is of $TiB_2$.

4. The semiconductor apparatus of claim 1, wherein the semiconductor buffer layer is AlN.

5. The semiconductor apparatus of claim 4, wherein the thickness of the semiconductor buffer layer made of AlN is 10 to 250 nm.

6. The semiconductor apparatus of claim 1, wherein an angle θ1 formed by a normal line of the principal surface of the substrate and a normal line of the (0001) plane of the substrate is $0° \leq θ1 \leq 5°$.

7. A semiconductor apparatus comprising:
a substrate made of a diboride single crystal expressed by a chemical formula $XB_2$, in which X includes at least one of Ti, Zr, Nb and Hf;
a semiconductor buffer layer formed on a principal surface of the substrate and made of $(AlN)_x(GaN)_{1-x}$ ($0 < x \leq 1$); and
a nitride semiconductor layer formed on the semiconductor buffer layer, including at least one kind or plural kinds selected from among 13 group elements and As, wherein an angle θ1 formed by a normal line of the principal surface of the substrate and a normal line of the (0001) plane of the substrate is $0° \leq θ1 \leq 5°$.

8. The semiconductor apparatus of claim 4, wherein an angle θ1 formed by a normal line of the principal surface of the substrate and a normal line of the (0001) plane of the substrate is $0° \leq θ1 \leq 0.55°$.

9. The semiconductor apparatus of claim 1, wherein the substrate is eroded and removed by etching.

* * * * *